United States Patent
Yamazaki et al.

(10) Patent No.: US 6,233,195 B1
(45) Date of Patent: *May 15, 2001

(54) MULTI-BANK DRAM SUITABLE FOR INTEGRATION WITH PROCESSOR ON COMMON SEMICONDUCTOR CHIP

(75) Inventors: Akira Yamazaki; Katsumi Dosaka, both of Hyogo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/301,361

(22) Filed: Apr. 29, 1999

Related U.S. Application Data

(62) Division of application No. 09/080,276, filed on May 18, 1998, now Pat. No. 5,940,342, which is a division of application No. 08/797,081, filed on Feb. 10, 1997, now Pat. No. 5,774,409.

(30) Foreign Application Priority Data

Apr. 22, 1996 (JP) .................................................. 8-100146

(51) Int. Cl.[7] .................................................. G06F 12/08
(52) U.S. Cl. ................. 365/230.03; 365/49; 365/230.08; 365/230.06
(58) Field of Search ......................... 365/230.01, 230.03, 365/49; 711/1

(56) References Cited

U.S. PATENT DOCUMENTS

| | | | |
|---|---|---|---|
| 5,339,268 | * 8/1994 | Machida | 365/49 |
| 5,553,026 | 9/1996 | Nakai et al. . | |
| 5,587,950 | 12/1996 | Sawada et al. . | |
| 5,617,555 | 4/1997 | Patel et al. . | |
| 5,621,690 | 4/1997 | Jungroth et al. . | |
| 5,644,747 | 7/1997 | Kusuda . | |
| 5,652,723 | 7/1997 | Dosaka et al. . | |
| 5,663,923 | 9/1997 | Baltar et al. . | |
| 5,774,409 | * 6/1998 | Yamazaki et al. | 365/230.03 |
| 5,940,342 | * 8/1999 | Yamazaki et al. | 365/230.03 |
| 5,940,848 | * 8/1999 | Bains | 711/1 |

FOREIGN PATENT DOCUMENTS

| | | |
|---|---|---|
| 5-143445 | 6/1993 | (JP) . |
| 8-212185 | 8/1996 | (JP) . |

OTHER PUBLICATIONS

ISSCC95/Session 18 / Memories with Special Architectures/ Paper FP 18.2—1995 IEEE International solid-state Circuits Conference—ISSCC95 / Feb. 17, 1995 / Buena Vista 1:30 PM—pp. 302 & 303.

* cited by examiner

Primary Examiner—Viet Q. Nguyen

(57) ABSTRACT

A dynamic random access memory DRAM includes banks which are driven to active or inactive states independently of each other. Activation/inactivation of these banks are controlled by row controllers operating independently of each other, whereby a page or word line can be selected in each of the banks, a page hit rate can be increased, and the number of array precharge operation times in a page error as well as power consumption can be reduced in response. Thus, the cache hit rate of a processor having a built-in DRAM is increased and power consumption is reduced.

2 Claims, 27 Drawing Sheets

| #1 | PAGE ADDRESS #1 | TAG ADDRESS #1 |
|---|---|---|
| #2 | PAGE ADDRESS #2 | TAG ADDRESS #2 |
| ⋮ | ⋮ | ⋮ |
| #N | PAGE ADDRESS #N | TAG ADDRESS #N |

70    72

| #1 | PAGE ADDRESS #1 | P/A#1 | TAG ADDRESS #1 |
|---|---|---|---|
| #2 | PAGE ADDRESS #2 | P/A#2 | TAG ADDRESS #2 |
| ⋮ | ⋮ | ⋮ | ⋮ |
| #N | PAGE ADDRESS #N | P/A#N | TAG ADDRESS #N |

70   74   72

A21 = 0 : INSTRUCTION AREA,   A21 = 1 : DATA AREA

→ SUCCESSIVE PAGES ARE MAPPED IN EVERY OTHER BANK IN EACH AREA

MULTI-BANK DRAM SUITABLE FOR INTEGRATION WITH PROCESSOR ON COMMON SEMICONDUCTOR CHIP

This application is a divisional of application Ser. No. 09/080,276 filed May 18, 1998 now U.S. Pat. No. 5,940,342 which is a divisional of application Ser. No. 08/797,081 filed Feb. 10, 1997 now U.S. Pat. No. 5,774,409.

RELATED APPLICATIONS

This application is related to U.S. application Ser. No. 08/500,039 filed Jul. 10, 1995, U.S. application Ser. No. 08/674,874 filed Jul. 2, 1996 and U.S. application Ser. No. 08/788,803 filed Jan. 23, 1997, all of which are incorporated herein by reference.

BACKGROUND OF THE INVENTION

1. Field of the Invention

The present invention relates to a semiconductor memory device and a control circuit therefor, and more particularly, it relates to a structure for efficiently accessing a semiconductor memory device in a circuit device including a processor and the semiconductor memory device which are integrated on a common semiconductor chip (substrate).

2. Description of the Background Art

FIG. 40 schematically illustrates the structure of a conventional microprocessor having a built-in main memory. Referring to FIG. 40, a DRAM (dynamic random access memory) serving as a main memory and a CPU (central processing unit) serving as a processor are integrated on a common semiconductor chip in the conventional microprocessor. This microprocessor further includes an SRAM (static random access memory) cache SCH for storing data/instructions relatively frequently accessed by the CPU for efficiently transferring data between the DRAM and the CPU, a data queue DTQ for queuing and storing the data used by the CPU, an instruction queue ITQ for queuing and storing the instructions executed by the CPU, a tag memory TGM for storing addresses of the data stored in the SRAM cache SCH, and a memory controller MCL for referring to the tag memory TGM in accordance with access requests from the CPU, determining whether or not required data/instructions are stored in the SRAM cache SCH and performing necessary control in accordance with the result of the determination.

The memory controller MCL controls data read/write operations of the instruction queue ITQ, the data queue DTQ and the SRAM cache SCH, while controlling reading/writing of data/instructions from/in the DRAM. The DRAM, the instruction queue ITQ, the data queue DTQ and the SRAM cache SCH are interconnected with each other by a data bus DBS. The memory controller MCL transmits commands for instructing necessary operations to the DRAM through a DRAM control bus CBS, and outputs addresses specifying accessed memory positions of the DRAM through a DRAM address bus ABS. The operation is now briefly described.

In accordance with an access request from the CPU, the memory controller MCL refers to the tag memory TGM in accordance with an address signal supplied together with this access request, and determines whether or not data access-requested by the CPU is present in the SRAM cache SCH. The tag memory TGM stores respective addresses (cache block (set) addresses) of a plurality of cache blocks stored in the SRAM cache SCH in tag address positions. The memory controller MCL supplies the tag memory TGM with a cache block address (set address) and a tag address in the address signal received from the CPU. The tag memory TGM reads the corresponding cache block address (set address) in accordance with the supplied tag address, and determines whether or not the read set address matches that supplied from the memory controller MCL. If the set addresses match each other, the tag memory TGM asserts a signal CH indicating a cache hit. If these addresses mismatch each other, on the other hand, the cache hit signal CH from the tag memory TGM is negated.

The memory controller MCL controls necessary data transfer in accordance with the cache hit/miss indication signal CH supplied from the tag memory TGM. In case of a cache hit, the memory controller MCL transfers the instruction/data access-requested by the CPU to the instruction queue ITQ or the data queue DTQ from the SRAM cache SCH. Then, the instruction queue ITQ or the data queue DTA supplies the instruction or the data to the CPU. After this transfer, the memory controller MCL transfers the remaining instructions/data of the access-requested cache block to the instruction queue ITQ or the data queue DTQ from the SRAM cache SCH at need.

In case of a cache miss, on the other hand, the memory controller MCL informs the CPU of the cache miss in which no necessary instruction/data is supplied if no usable instruction/data is present in the queue ITQ or DTQ, and temporarily interrupts the operation of the CPU. The memory controller MCL accesses the DRAM through the DRAM control bus CBS and the DRAM address bus ABS, and transfers a cache block including the data access-requested by the CPU to the SRAM cache SCH through the data bus DBS. In this data transfer, the DRAM transfers an instruction/data to the instruction queue ITQ or the data queue DTQ. Whether what is transferred is instruction or data is determined by a bit supplied from the CPU to the memory controller MCL. If an instruction/data is present in the instruction queue ITQ or the data queue DTQ during the data transfer from the DRAM to the queue ITQ or DTQ and the SRAM cache SCH, the memory controller MCL allows the CPU to access the instruction queue ITQ or the data queue DTQ. A penalty for the cache miss is reduced by using the queue.

As hereinabove described, necessary data of cache blocks stored in the SRAM cache SCH are queued and stored in the instruction queue ITQ and the data queue DTQ respectively through the fact that localization is present in address positions accessed by the CPU (successive addresses are sequentially accessed in a single processing), whereby necessary data can be transferred to the CPU at a high speed.

Further, the DRAM and the CPU are integrated and formed on the common semiconductor chip, whereby the data can be transferred between the DRAM, the instruction queue ITQ, the data queue DTQ and the SRAM cache SCH at a high speed. Namely, the line capacitance of the internal data bus DBS which is provided on the semiconductor chip is so small that the data can be transferred at a higher speed as compared with a case of employing a discrete DRAM. While data transfer is limited by the number of data input/output pin terminals in case of employing a discrete DRAM, a large quantity of data/instructions can be simultaneously transferred by employing the internal data bus DBS having a large bit width, whereby high-speed data transfer is implemented.

FIG. 41 schematically illustrates the internal structure of the DRAM shown in FIG. 40.

Referring to FIG. 41, the DRAM includes a command latch 900 for latching a command supplied from the memory controller MCL through the DRAM control bus CBS in synchronization with a clock signal P1, an address latch 901 for latching an address signal supplied from the memory controller MCL through the DRAM address bus ABS in synchronization with the clock signal P1, a DRAM row controller 902 for decoding the command latched by the command latch 900 and generating a necessary control signal in accordance with the result of the decoding, a row address latch (row latch) 903 for latching an internal address signal Ad supplied from the address latch 901 in response to a row address latch instruction signal RAL from the DRAM controller 902, a row predecoder 904 for predecoding a row address signal RA from the row address latch 903 and outputting a row selection signal X, a DRAM column controller 906 for decoding the command from the command latch 900 and outputting a control signal related to column selection in accordance with the result of the decoding, a column address latch (column latch) 908 for latching the internal address signal Ad supplied from the address latch 901 in response to a column address latch instruction signal CAL from the DRAM column controller 906, a column predecoder 910 for predecoding an internal column address signal CA from the column address latch 908 and outputting a column selection signal Y, and a DRAM array 912 having dynamic memory cells arranged in a matrix.

This DRAM array 912 further includes a peripheral control circuit for sensing, amplifying and reading/writing data from/in a selected memory cell.

A row related control signal from the DRAM row controller 902 related to row selection is supplied to a row related control circuit included in the DRAM array 912, while a column related control signal from the DRAM column controller 906 is supplied to a column related control circuit included in the DRAM array 912 for performing an operation related to column selection.

The predecode signals X and Y from the row and column predecoders 904 and 910 are further decoded by row and column decoders (not shown) provided in the DRAM array 912 respectively, for selecting corresponding row and column respectively.

The DRAM shown in FIG. 41 incorporates a command and an address signal in synchronization with the clock signal P1, which in turn also determines a data output timing. The operation is now briefly described.

A control signal from the memory controller MCL (see FIG. 40) is outputted in the form of a command, and latched by the command latch 900 in synchronization with the clock signal P1. On the other hand, an address signal from the memory controller MCL is latched by the address latch 901 in synchronization with the clock signal P1.

A case is considered that the command instructs activation of row selection in the DRAM array 912, i.e., activation of a word line. The DRAM controller 902 decodes the row active command supplied from the command latch 900, activates the row address latch instruction signal RAL, and makes the row address latch 903 latch the address signal Ad supplied from the address latch 901. The internal row address signal RA latched by the row address latch 903 is predecoded by the row predecoder 904 (this activation timing is decided by the DRAM row controller 902), and supplied to the row decoder included in the DRAM array 912.

In the DRAM array 912, the row decoder (not shown) further decodes the predecoded signal X, and selects a corresponding row (word line). Thus, the DRAM array 912 is activated. Thereafter a sense amplifier (not shown) included in the DRAM array 912 senses and amplifies data of a memory cell on the selected row in accordance with the row related control signal from the DRAM row controller 902.

Another case is considered that the memory controller MCL supplies a read or write command instructing data reading or writing. In this case, the DRAM array 912 has already been activated to have a row (word line) selected, and memory cell data connected to the selected word line has been sensed and amplified and thereafter latched by the sense amplifier.

When the read or write command is supplied, the DRAM column controller 906 decodes this command, activates the column address latch instruction signal CAL, and makes the column address latch 908 latch the internal address signal Ad supplied from the address latch 901. Then, the column predecoder 910 predecodes the internal column address signal CA supplied from the column address latch 908, for supplying to the column decoder (not shown) included in the DRAM array 912.

This column decoder (not shown) decodes the column predecode signal Y, and selects the corresponding column of the DRAM array 912. The data is read from or written in the selected column through the data bus DBS. This data reading/writing is executed by a read or write circuit (not shown) included in the DRAM array 912 (this read/write circuit is controlled by the column related control signal).

The data reading/writing on the data bus DBS is executed in synchronization with the clock signal P1. Command and address signals are inputted and data is read/written in synchronization with the clock signal P1, whereby memory cell selection can be performed at a faster timing because of no necessity of considering a timing margin for a signal skew, and the access time is reduced in response. Further, the data is read/written in synchronization with the clock signal P1, whereby the data read/write speed is decided by the clock signal P1, resulting in high-speed data transfer.

Further case is considered that a copy operation is performed for transferring a data block Ds of a certain page of the DRAM array 912 to another page, as shown in FIG. 42A. The term "page" corresponds to a word line in the DRAM array 912. In other words, considered is an operation of transferring the data block Ds on a word line WLs onto another word line WLd, as shown in FIG. 42A. As to a main storage update algorithm, it is assumed that data which is written in the SRAM cache SCH is also written in the corresponding address position of the DRAM 912 (write through). Namely, no data block is transferred from the SRAM cache SCH to the DRAM 912 in a cache miss. This data block transfer operation is now described with reference to a timing chart shown in FIG. 42B.

A case is considered that the SRAM cache SCH stores another data block on the word line WLs. When the CPU makes an access request, this results in a cache miss since the data block Ds is not stored in the SRAM cache SCH. This is a "page hit" case, and the DRAM controller 902 generates a read command DRT. In accordance with this input command DRT, the column address latch instruction signal CAL supplied from the DRAM controller 906 is temporarily inactivated, and the column address latch 908 is released from a latch state and brought into a through state. Therefore, the column address latch 908 (see FIG. 41) outputs a column address signal CAs which is supplied simultaneously with the read command DRT. The column address latch 908 latches this column address signal CAs when the column address latch instruction signal CAL is activated again.

In accordance with the latched column address signal CAs, column selection is performed in accordance with the column predecoder 910 and the column decoder, so that the data block specified by the column address CAs on the selected word line WLs is read on a global I/O bus GIO which is an internal data bus of the DRAM array 912. An input/output circuit (not shown) of the DRAM array 912 reads in the data block Ds which is read on the global I/O bus GIO in synchronization with the clock signal P1, and outputs the same onto the data bus DBS. The read data block Ds is transferred to the data queue DTQ, and then stored in a general register in the CPU.

Then, the CPU outputs an access request again. This new access request specifies another page, and hence the memory controller MCL generates a precharge command PCG and supplies the same to the DRAM. In the DRAM, the DRAM array 912 is inactivated (the selected word line WLs is brought into a non-selected state) in accordance with the precharge command PCG under control by the DRAM row controller 902. Further, the respective circuits in the DRAM array 912 return to precharge states. In the following description, the wording "activation of the array" indicates such a state that a word line of the DRAM array 912 is driven to a selected state so that the sense amplifier latches memory cell data, and the wording "the array is inactivated" indicates such a state that each signal line of the array 912 returns to a prescribed precharge potential.

After a lapse of a clock cycle corresponding to a prescribed RAS precharge period tRP after supply of the precharge command PCG, a row related activation command (active command) ACT is generated and a destination row address (page address) is outputted. In accordance with the active command ACT, the DRAM row controller 902 temporarily inactivates the row address latch instruction signal RAL, and makes the row address latch 903 latch a row address signal RAd. Then, a corresponding page (word line) WLd is driven to a selected state in accordance with the incorporated row address signal RAd.

After a lapse of a clock cycle corresponding to a RAS-CAS delay time, the memory controller MCL generates a write command DWT and supplies the same to the DRAM. The DRAM temporarily inactivates the column address latch instruction signal CAL in accordance with the write command DWT, and incorporates a column address signal CAd supplied together with the write command DWT for performing column selection. Simultaneously with the write command DWT, the CPU transmits data (Dd) which has been stored in its general register onto the data bus DBS. The data on the data bus DBS is incorporated in the interior of the DRAM in accordance with the write command DWT, and transferred onto the DRAM global I/O bus GIO. Then, the data Dd is transferred from the global I/O bus GIO to a column CLd selected in accordance with the column address signal CAd, and written in a selected memory cell on the word line WLd.

As hereinabove described, the DRAM must be temporarily returned to a precharge state for a subsequent activation thereof if the bank number is one, data is transferred from a certain memory address position to another one for copying, and these memory address positions are frequently not present in the same page. Therefore, a precharge operation and page selection must be performed in the DRAM and the data cannot be transferred at a high speed, and hence the system performance is disadvantageously reduced.

Further, a precharge operation and word line selection (array activation) of the DRAM array 912 must be performed, and signal lines are charged/discharged in the DRAM array 912, and hence power consumption is disadvantageously increased. In case of a single-bank structure, further, only one page is selected in the DRAM, and the page hit rate cannot be increased.

SUMMARY OF THE INVENTION

An object of the present invention is to provide a semiconductor memory device which can improve the page hit rate, and a control circuit therefor.

Another object of the present invention is to provide a semiconductor memory device which can access necessary data at a high speed, and a control circuit therefor.

The present invention having various characteristics includes the following principal characteristics:

A semiconductor integrated circuit device according to a first aspect of the present invention includes an arithmetic processing unit for processing supplied data, and a memory unit which is formed on the same semiconductor chip as the arithmetic processing unit for storing at least either data or an instruction for the arithmetic processing unit. The memory unit includes a plurality of banks which are activated/inactivated independently of each other.

A semiconductor memory device according to a second aspect of the present invention includes a memory array having a plurality of memory blocks each having a plurality of memory cells arranged in a matrix, bank control circuitry provided in correspondence to the respective ones of the plurality of memory blocks for activating/inactivating the plurality of memory blocks independently of each other, an internal data bus which is provided on the same chip as the memory array in common for the plurality of memory blocks for transmitting/receiving data to/from a selected memory block, and data input/output circuitry for transferring data between the internal data bus and the exterior of the semiconductor memory device.

A semiconductor memory device according to a third aspect of the present invention includes a memory cell array having a plurality of memory cells arranged in a matrix, address buffer circuitry for receiving an address signal specifying a row of the memory cell array for generating and latching an internal address signal, and row selection/driving circuitry for decoding the internal address signal from the address buffer circuitry and driving a corresponding row to a selected state. The row selection/driving circuitry includes a latch for latching the result of the decoding.

A semiconductor memory device according to a fourth aspect of the present invention includes a plurality of memory blocks each having a plurality of memory cells arranged in a matrix, address generation circuitry for receiving and latching an address signal and outputting an internal address signal, and row selection/driving circuits provided in correspondence to each of the plurality of memory blocks and activated in response to a block specifying signal for decoding the internal address signal from the address generation circuitry and driving a row of the corresponding memory block to a selected state. Each of the row selection/driving circuits includes latch means for latching the result of the decoding.

A semiconductor memory device according to a fifth aspect of the present invention includes a plurality of memory blocks, which are arranged in parallel with each other and each having a plurality of memory cells arranged in a matrix, a plurality of sense amplifier bands arranged to be shared by adjacent ones of the plurality of memory blocks for detecting and amplifying data of memory cells of selected rows of the corresponding memory blocks respectively, and row selection control circuitry for driving the plurality of memory blocks independently of each other and activating/inactivating row selection for the memory blocks. The row selection control circuitry includes a circuit for driving memory blocks sharing a corresponding sense amplifier band and the sense amplifier band to inactive states in response to activation of the sense amplifier band of the corresponding memory blocks and inactivation of the corresponding memory blocks in response to a memory block specifying signal and a sense amplifier band activation signal, and a circuit for starting row selection of the corresponding memory blocks in response to the inactivation by the inactivation circuit.

A semiconductor memory device according to a sixth aspect of the present invention includes a plurality of. memory blocks each having a plurality of memory cells in a matrix, and control circuitry for activating/inactivating the plurality of memory blocks independently of each other. The control circuitry includes a circuit for driving the respective ones of the plurality of memory blocks into active states in response to starting up of the device.

A semiconductor integrated circuit device according to a seventh aspect of the present invention includes a memory unit having a plurality of memory blocks, each having a plurality of memory cells arranged in a matrix, and driven to active/inactive states independently of others, and a unit for storing a tag address indicating the position of a most recently accessed data block in each of the plurality of memory blocks together with a flag indicating whether or not the corresponding memory block is in an active state in correspondence to each of the plurality of memory blocks.

A control circuit according to an eighth aspect of the present invention is applied to a semiconductor memory device having a plurality of memory blocks, each having a plurality of pages, and driven to active/inactive states independently of others, and includes a page memory for selecting a page address specifying a selected page in each memory block, and a refresh controller for inactivating the specified memory block in response to a refresh instruction signal including a memory block specifying signal and thereafter refreshing the specified memory block. The refresh controller includes a circuit for driving a corresponding page of the refreshed memory block to a selected state in accordance with the page address stored in the page memory after completion of the refreshing.

A control circuit according to a ninth aspect of the present invention is applied to a semiconductor memory device having a plurality of memory blocks each having a plurality of pages and driven to active/inactive states independently of others, and includes a page memory for storing a page address specifying a selected page in each memory block, and refresh controller for inactivating a specified memory block in response to a refresh instruction signal including a memory block specifying signal and thereafter refreshing the specified memory block. The refresh controller includes means for maintaining the refreshed memory block in a precharge state until a next access instruction is supplied after completion of the refreshing.

An address allocation circuit-according to a tenth aspect of the present invention is applied to a semiconductor memory device having a plurality of banks each having a plurality of pages, and driven to active/inactive states independently of others and accessed by a processor, and includes a circuit for converting an address from the processor such that a page address specifying successive pages in a processor address space specifies different ones of the plurality of banks for address mapping.

A cache hit/miss determination circuit according to an eleventh aspect of the present invention is a circuit for determining a hit/miss of an access to a semiconductor memory device having a plurality of banks each having a plurality of pages and driven to active/inactive states independently of others, and includes tag/page address storage having a page address area for storing a page address specifying a page selected in each of the banks and a tag memory area for storing a tag address specifying a data block on a most recently accessed page in each of the banks, a unit for reading a corresponding tag address from the tag memory area in accordance with a supplied address while reading a corresponding page address of the specified bank from the tag/page address storage in accordance with the supplied address, a cache hit/miss determination unit for determining match/mismatch of a block address corresponding to the tag address of the supplied address and the tag address read from the tag address memory area and outputting a signal indicating a cache hit/miss in accordance with the result of the determination, and page hit determination unit for determining match/mismatch of the page address read from the page address memory area and the address corresponding to the page address included in the supplied address and outputting a signal indicating a page hit/miss.

The semiconductor memory device is formed by a plurality of banks, whereby the number of simultaneously selected pages is increased and the page hit rate is improved even if the page size is limited in each bank.

The row selection/driving circuitry is provided with the circuit for latching the result of decoding of the address signal, whereby the rows (word lines) can be driven to selected states independently of each other in the memory blocks. Further, it is not necessary to separately provide a dedicated latch circuit, whereby increase of the device scale is suppressed.

In case of sharing the sense amplifier bands, a memory block is driven to a selected state after the adjacent memory block is inactivated, whereby destruction of data resulting from confliction of the sense amplifier band is prevented and correct page data can be selected. Further, the adjacent memory block is simply driven to a non-selected state in the interior and no precharge command needs not be supplied from the exterior, whereby the access time and power consumption are reduced.

The plurality of memory blocks are activated in starting-up of the device, whereby the device is prevented from being accessed while the memory blocks are in instable states, a malfunction is suppressed and the data can be correctly stored.

The flag indicating whether or not the corresponding memory block is in a selected state is linked with the tag address of each memory block, whereby non-selected memory blocks can be identified and readily driven to selected states, and the control is simplified.

Further, the respective memory blocks are so activated as to select a plurality of pages, and the page hit rate is improved.

The refreshed memory block is driven to the page selection state before the refreshing again after completion of self refreshing, whereby reduction of the page hit rate resulting from the refreshing can be suppressed.

The corresponding memory block is maintained in a precharge state after completion of the refreshing, whereby merely a page miss is temporarily caused and the corresponding page of the refreshed memory block is selected, and hence control of the refreshing is simplified while suppressing reduction of the page hit rate.

Further, address mapping is so performed that a page address specifying successive specifies pages of different banks, whereby the page hit rate can be remarkably improved due to access localization of the processor.

The processor address space is divided into a plurality of subaddress spaces for varying the address mapping mode with the subaddress spaces, whereby optimum page selection can be implemented in each subaddress and the page hit rate can be improved.

The tags and page addresses are stored together, whereby a page hit/miss can be readily determined without increasing the device scale.

Further, a page hit and a cache hit are simultaneously determined in parallel with each other, whereby an access penalty in a cache hit/page hit can be reduced.

The foregoing and other objects, features, aspects and advantages of the present invention will become more apparent from the following detailed description of the present invention when taken in conjunction with the accompanying drawings

BRIEF DESCRIPTION THE DRAWINGS

FIG. 1 schematically illustrates the structure of a principal part of a DRAM according to an embodiment 1 of the present invention;

Figure 4:
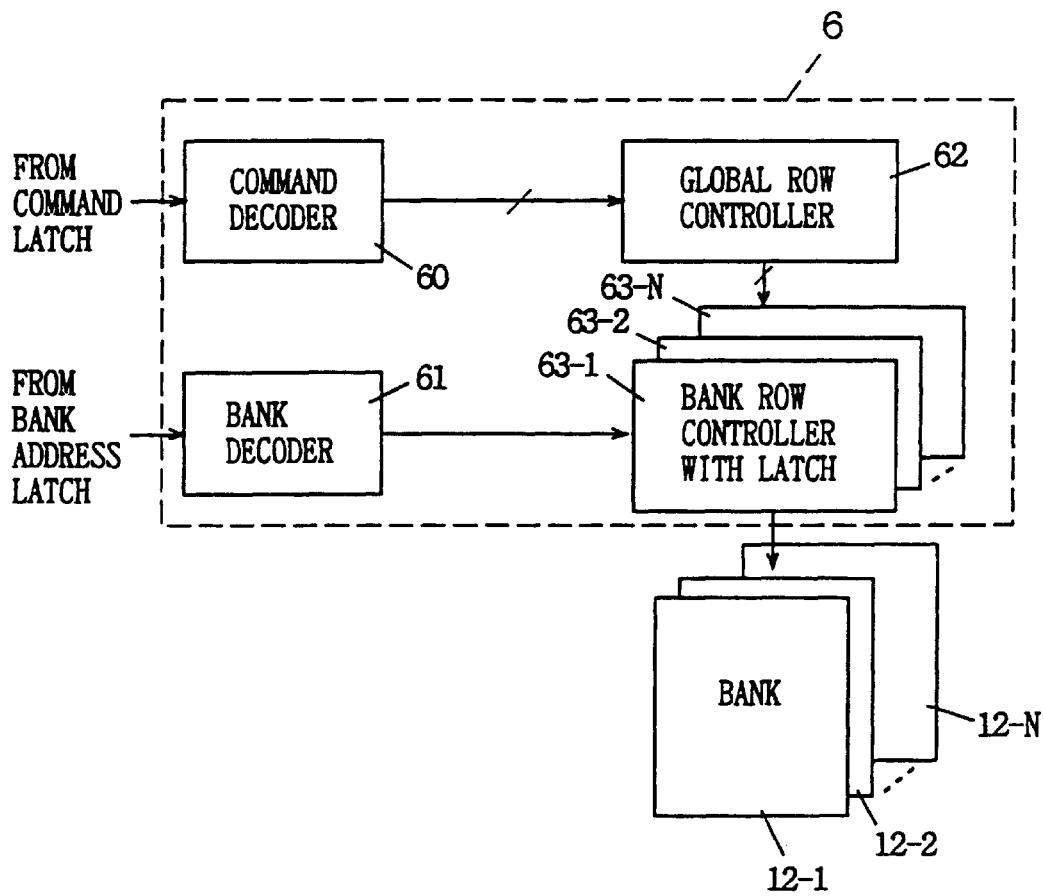
Figure 5:
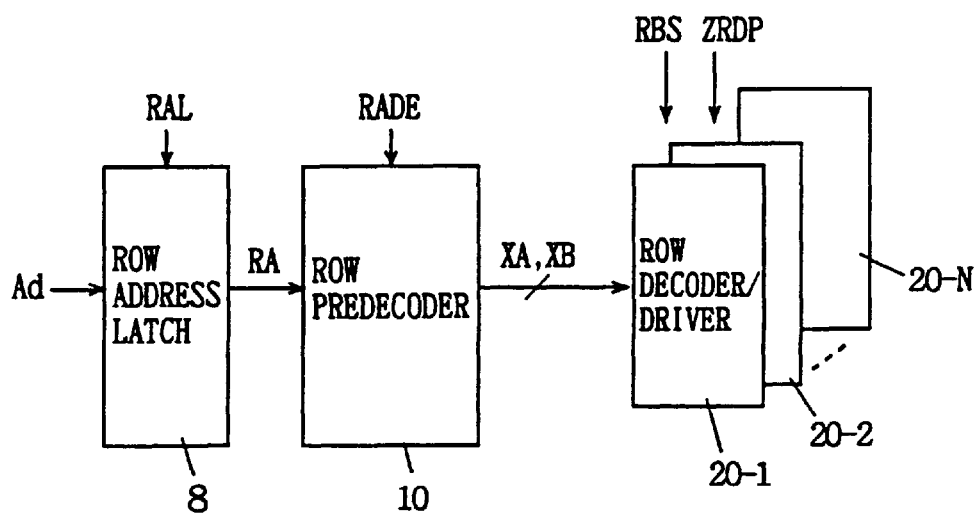
Figure 6:
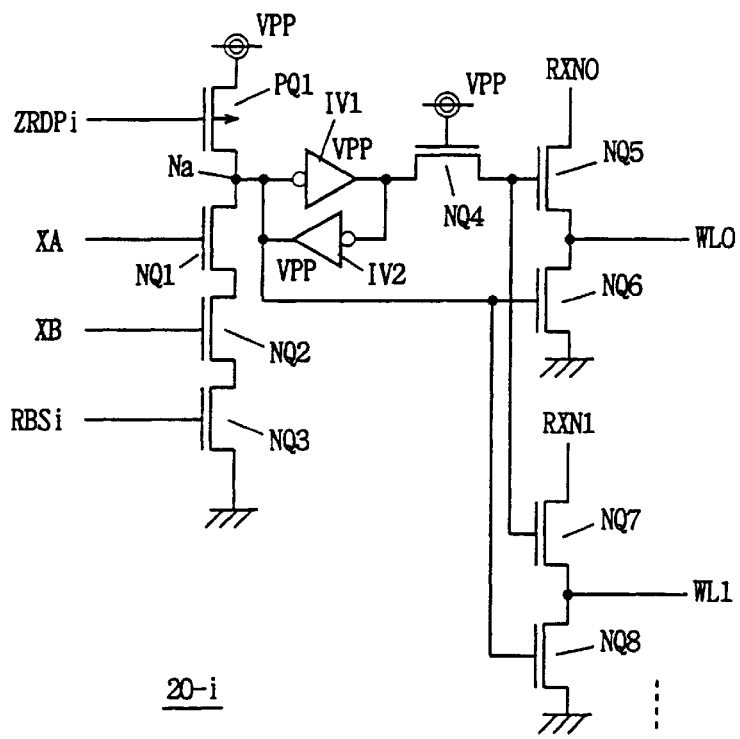
Figure 7:
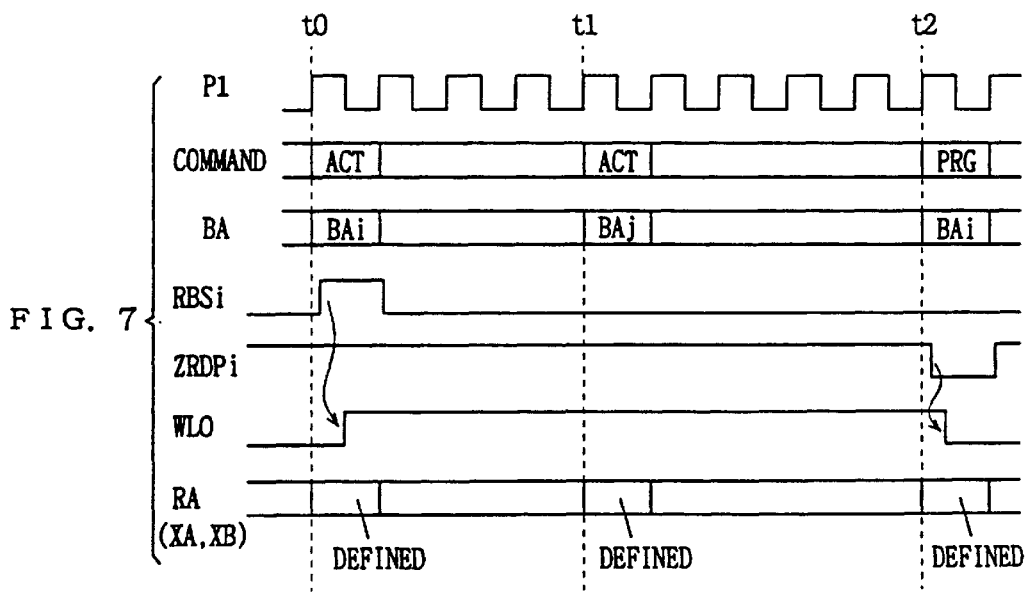
Figure 8A:
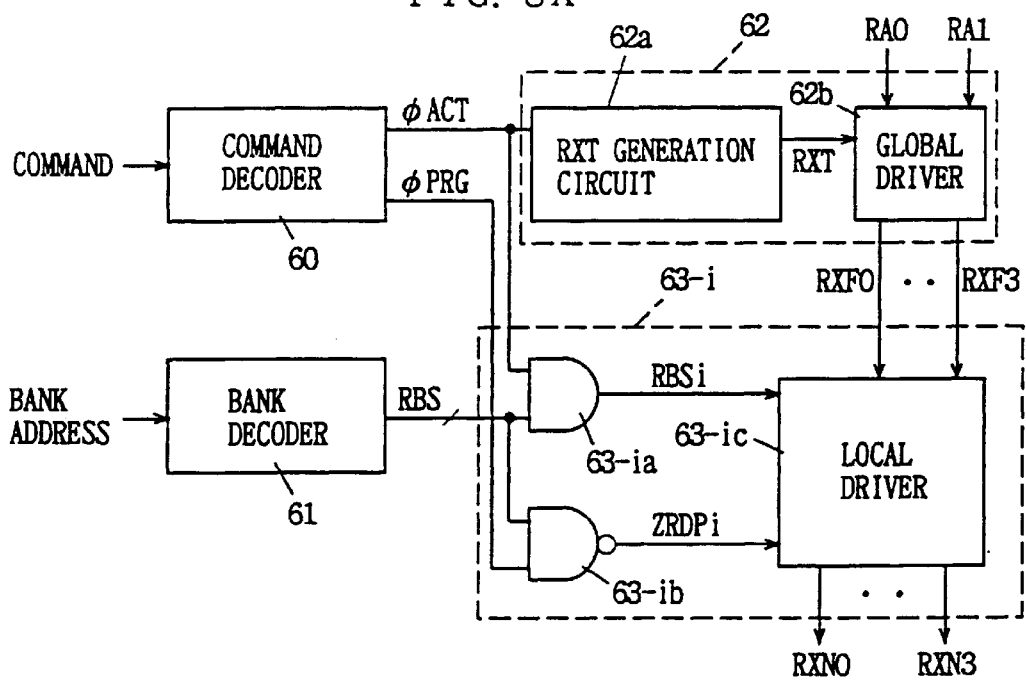
Figure 8B:
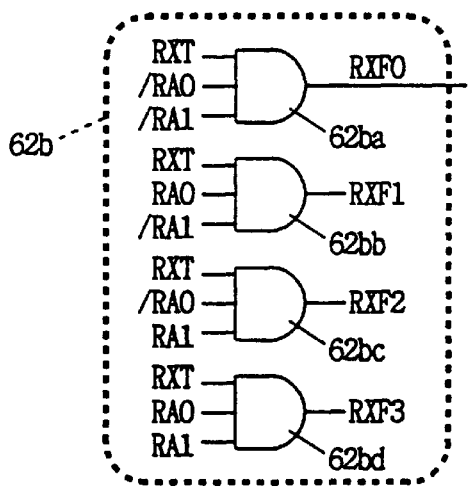
Figure 8C:
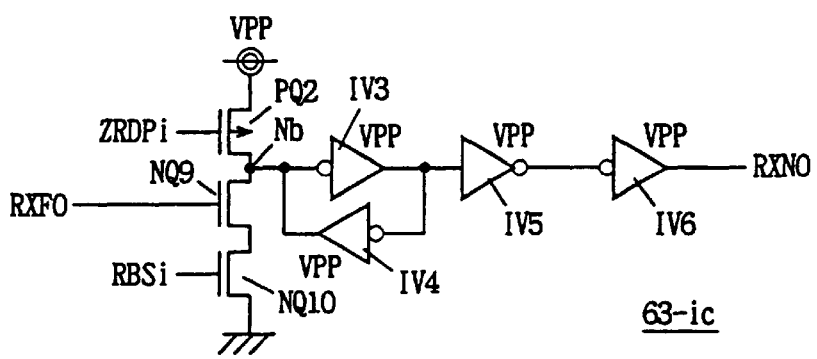
Figures 9, 10, 11:
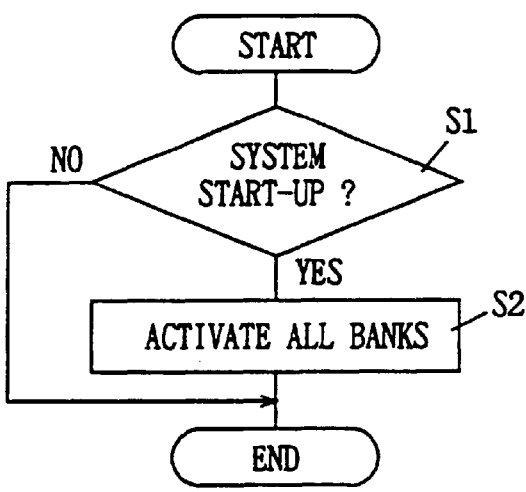
Figure 12:
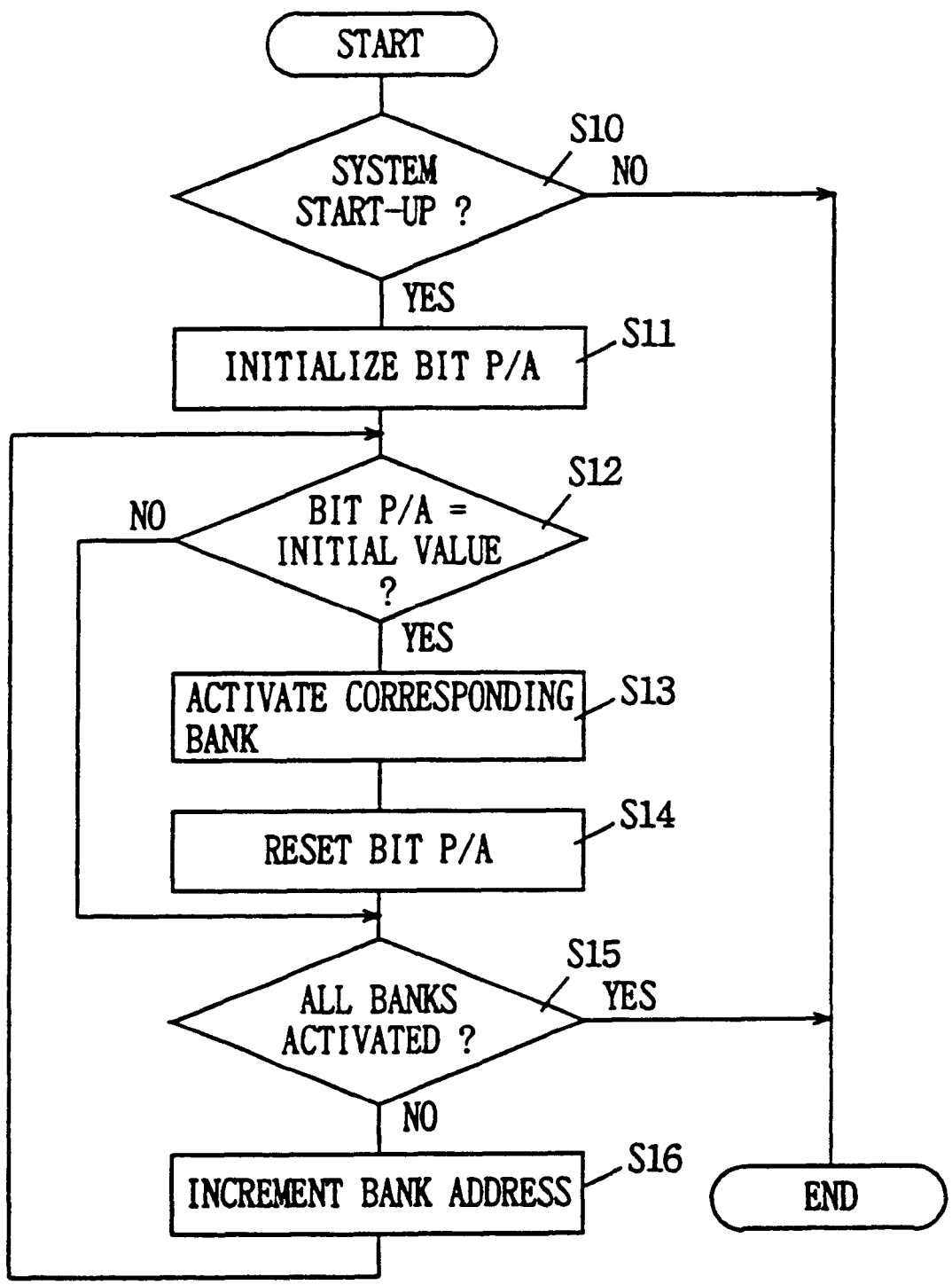
Figure 13:
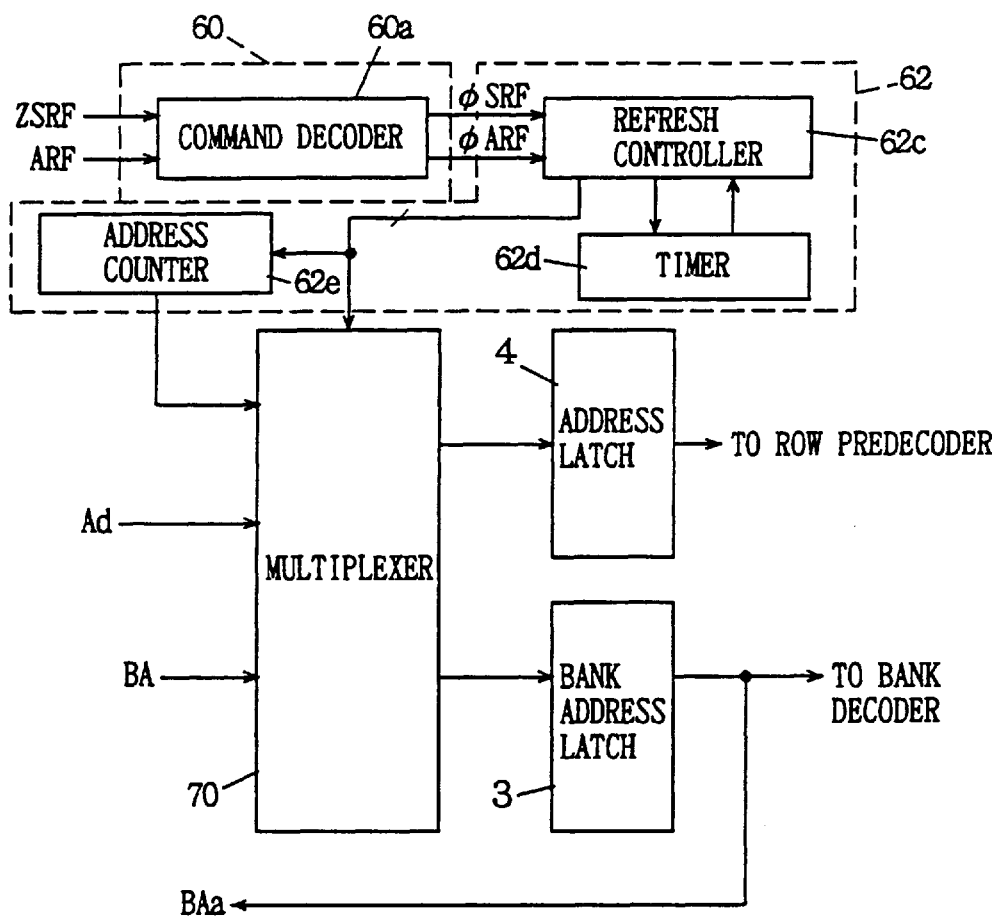
Figure 14:
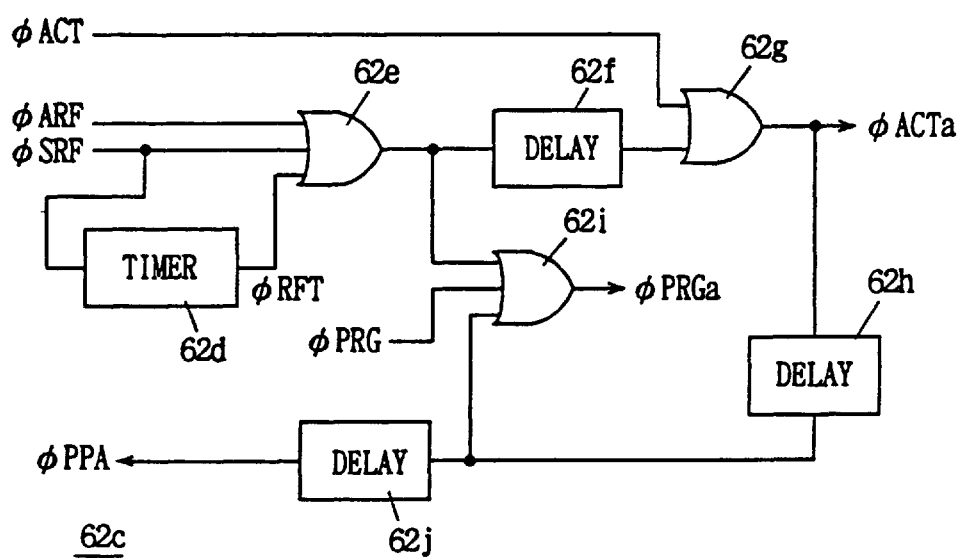
Figure 15:
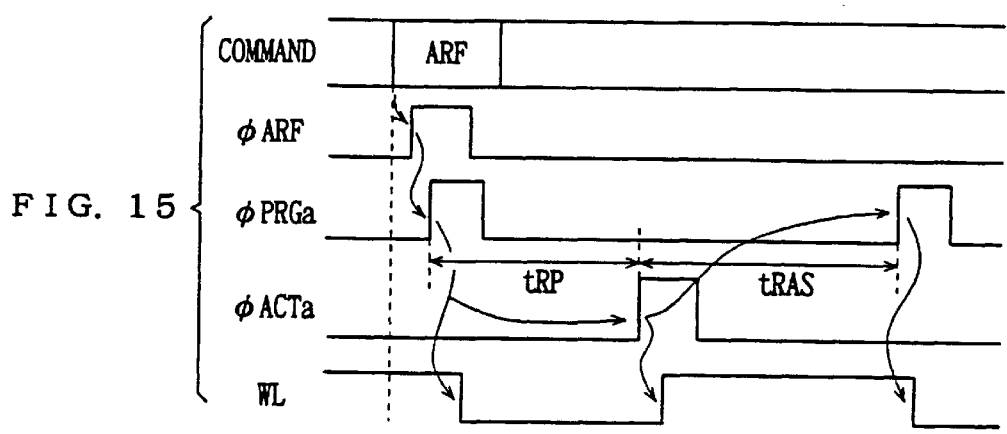
Figure 16:
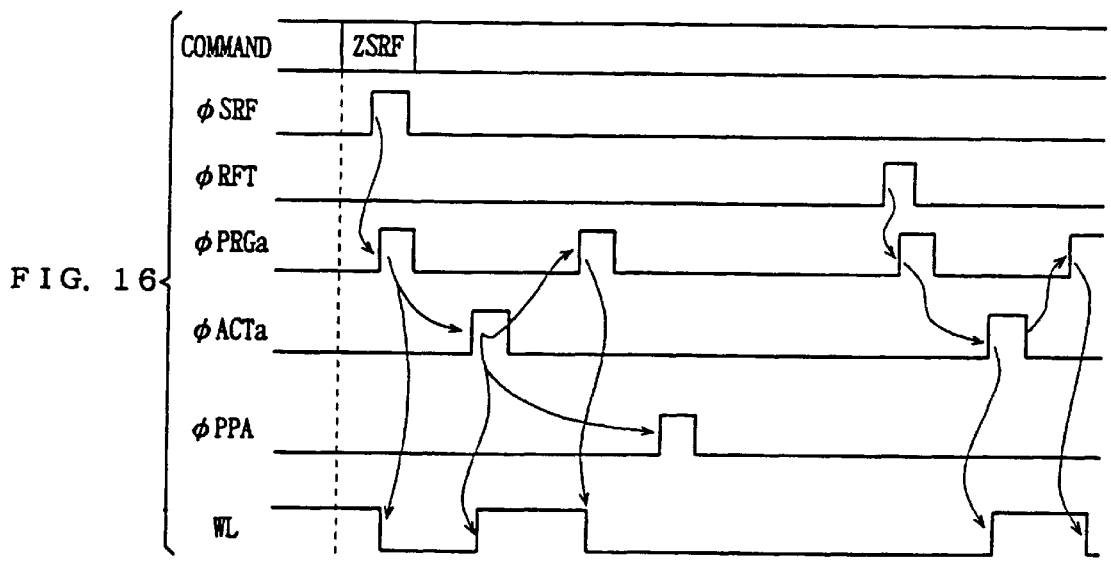
Figure 17:
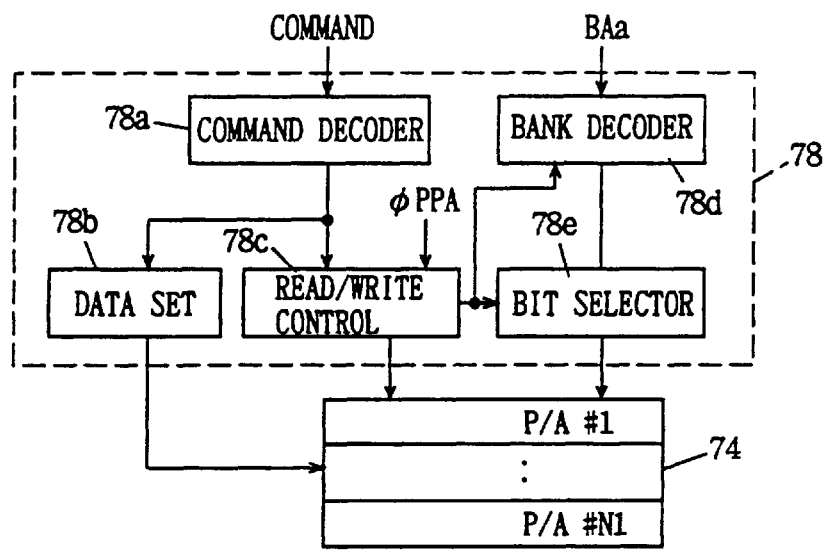
Figure 18:
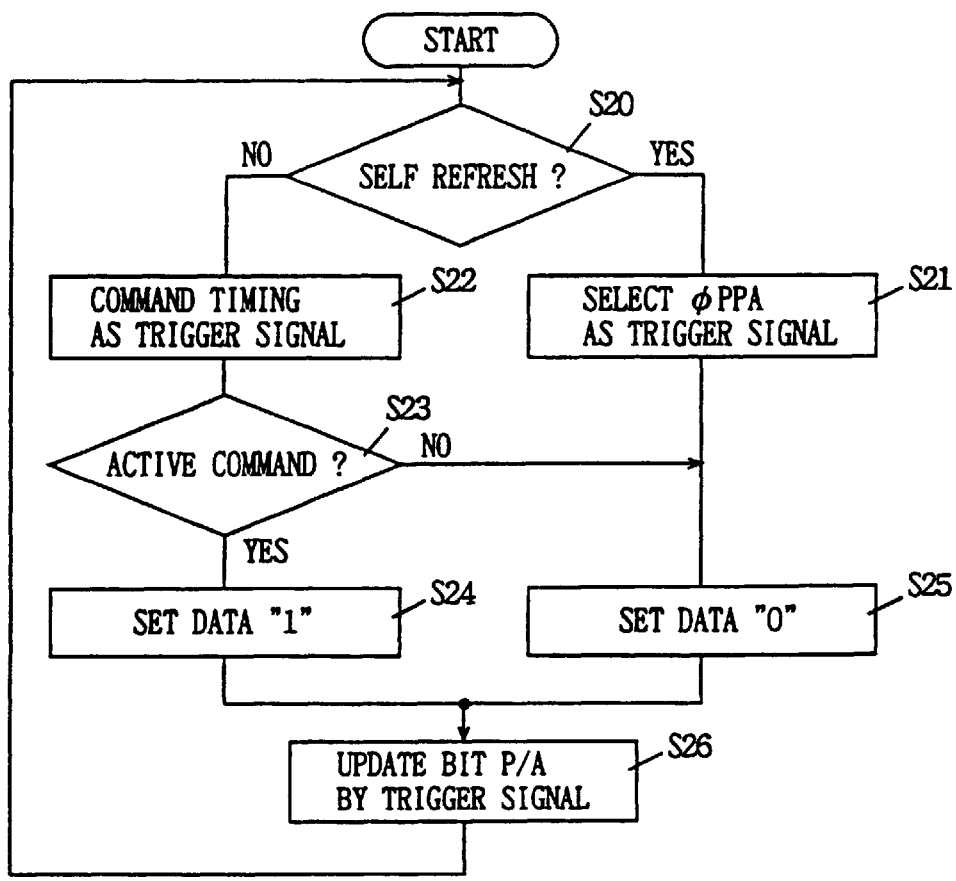
Figure 19:
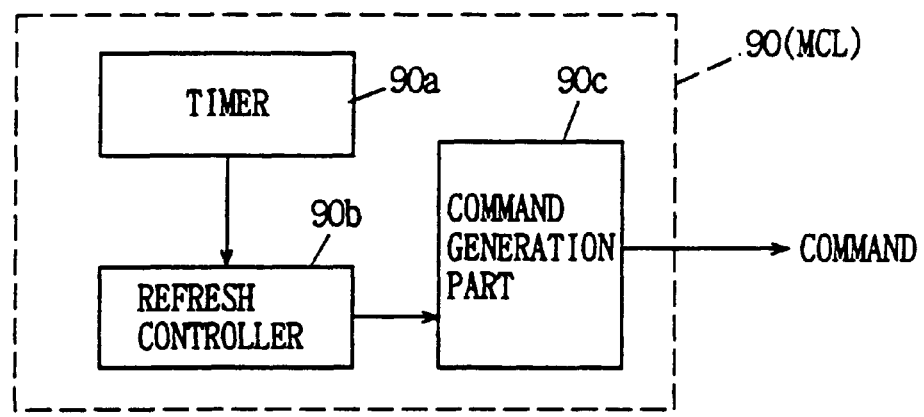
Figure 20:
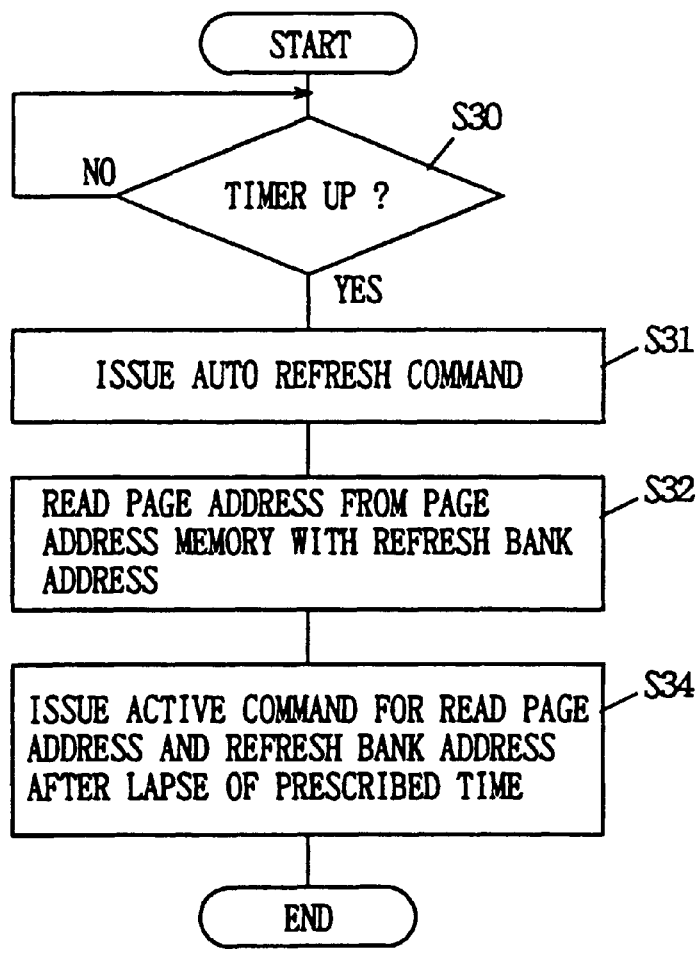
Figure 21:
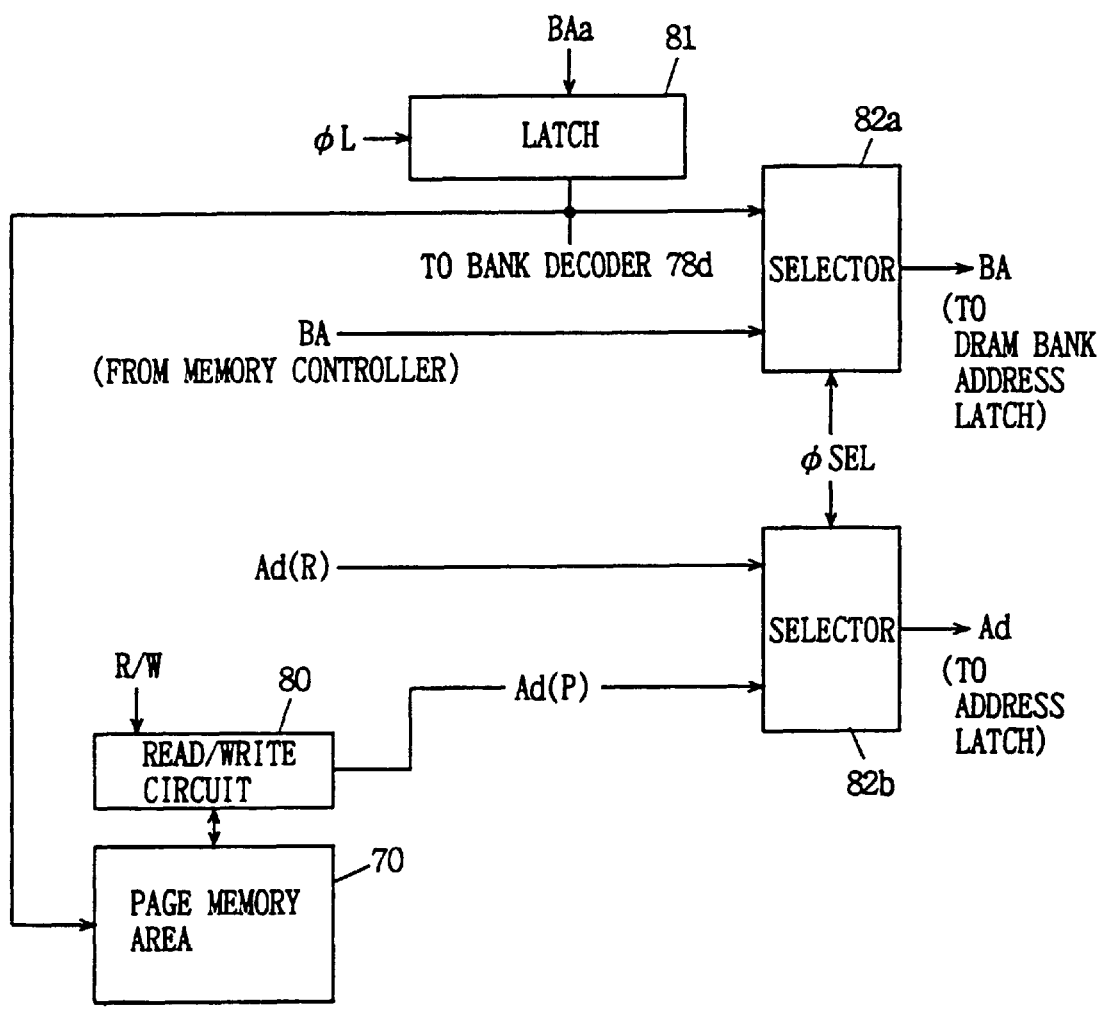
Figure 22:
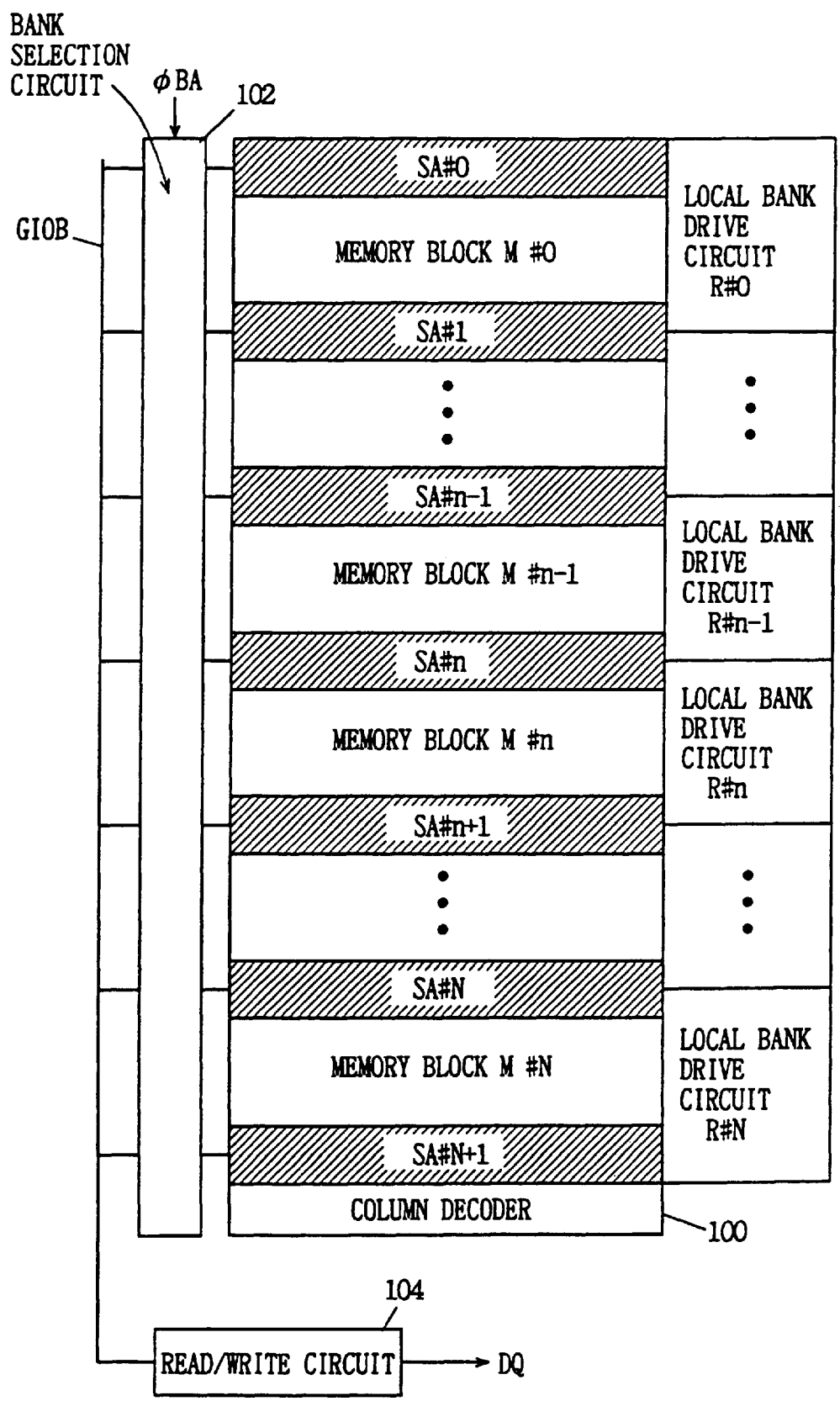
Figure 23:
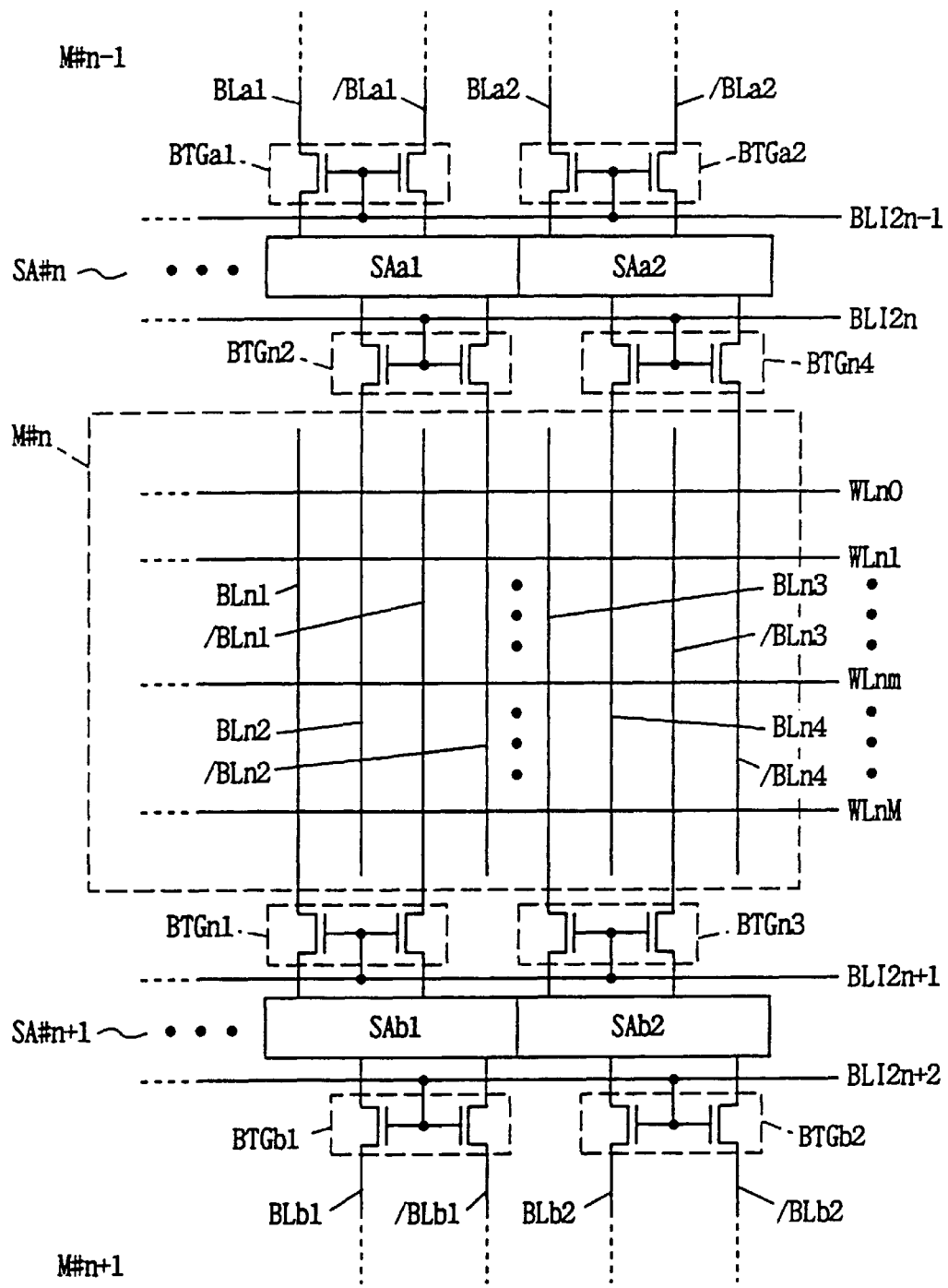
Figure 24:
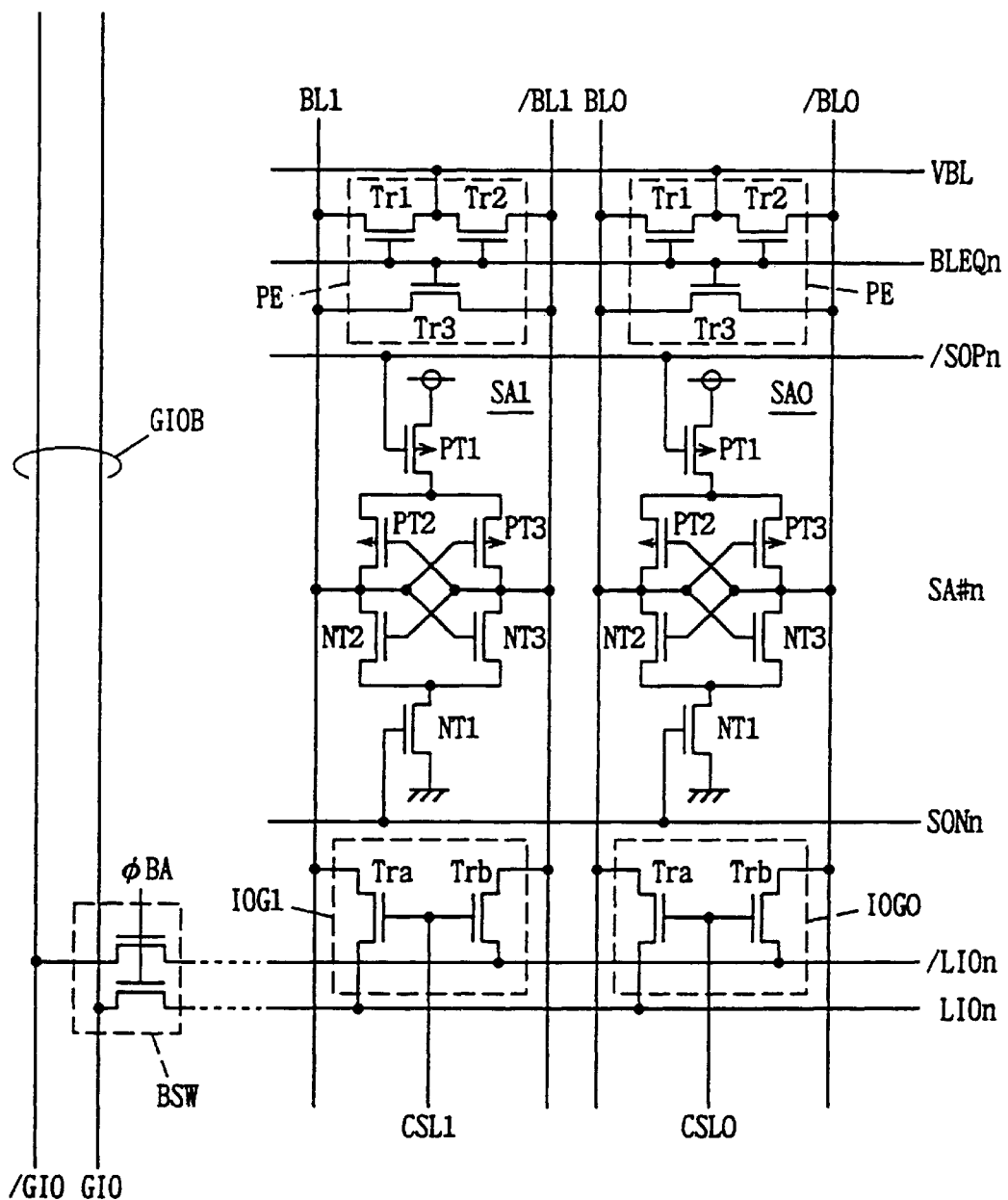
Figure 25:
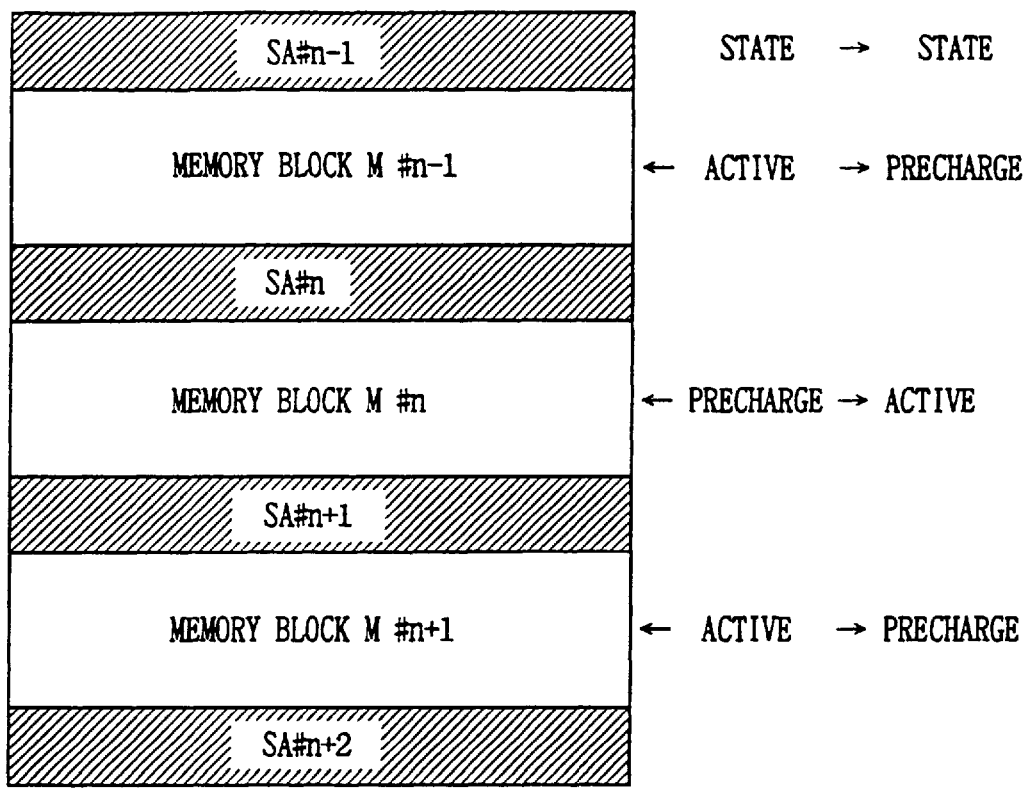
Figure 26:
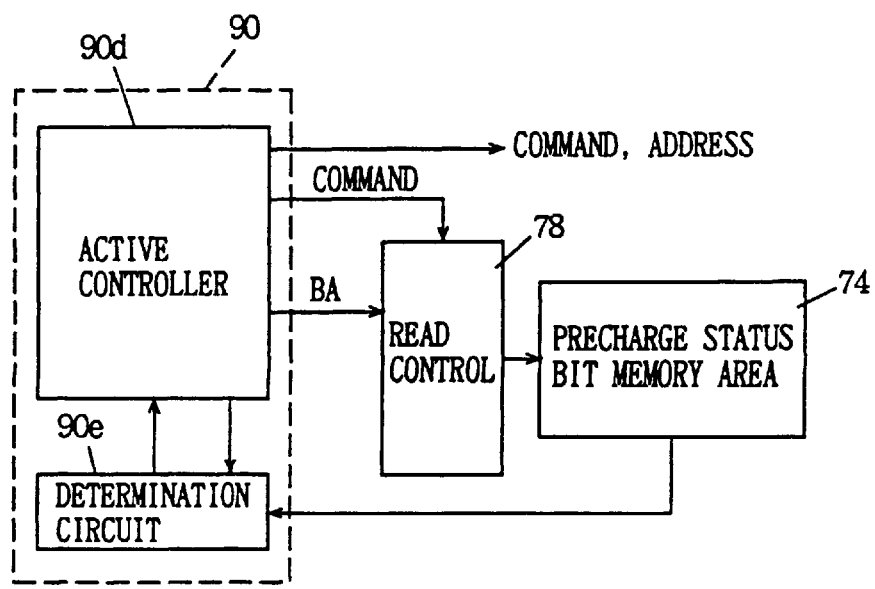
Figure 27:
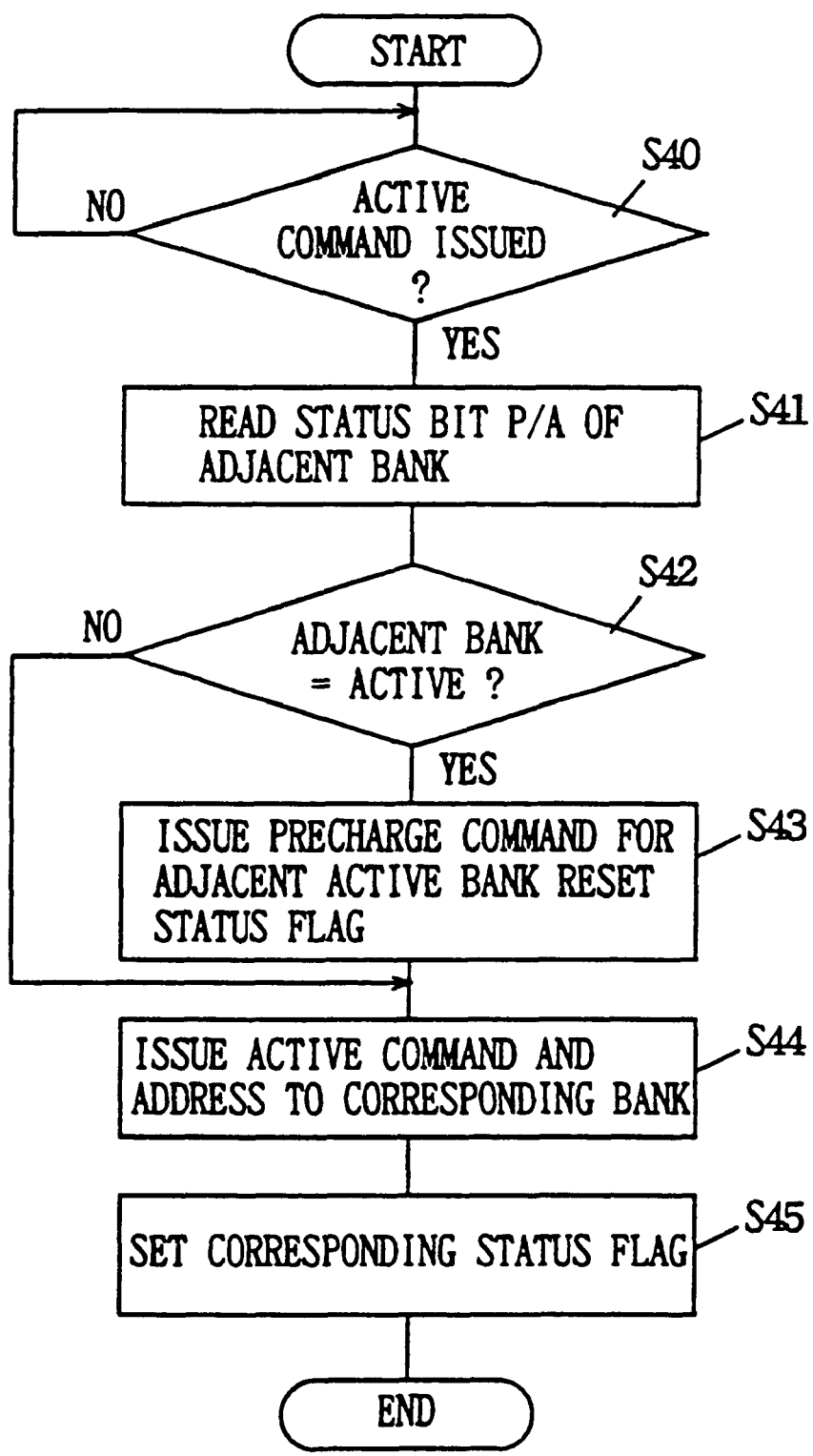
Figure 28A:
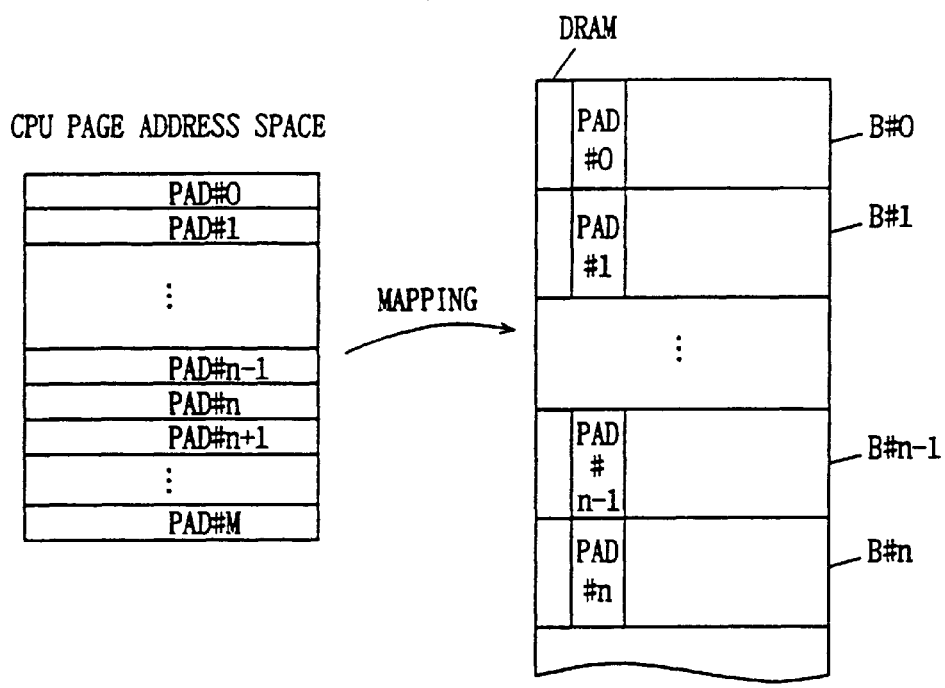
Figure 28B:
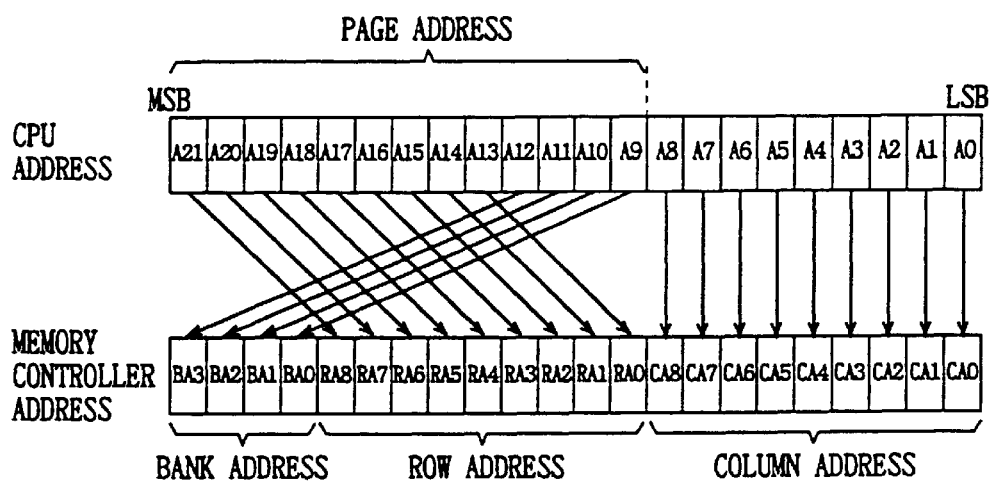
Figure 28C:
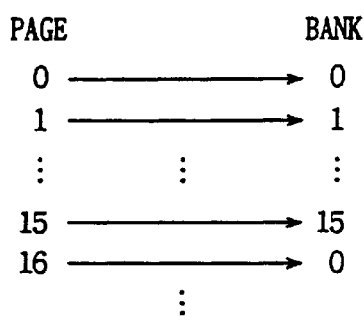
Figure 29:
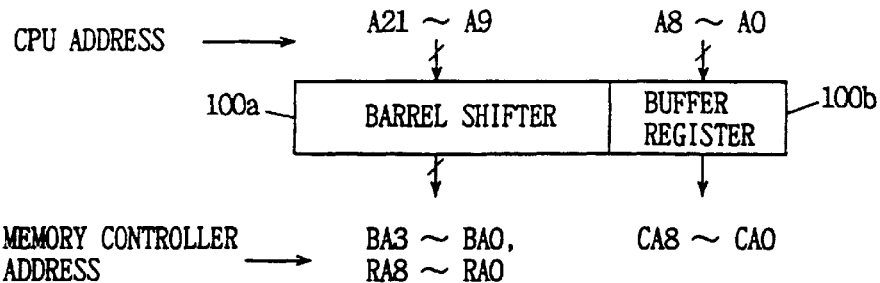
Figure 30A:
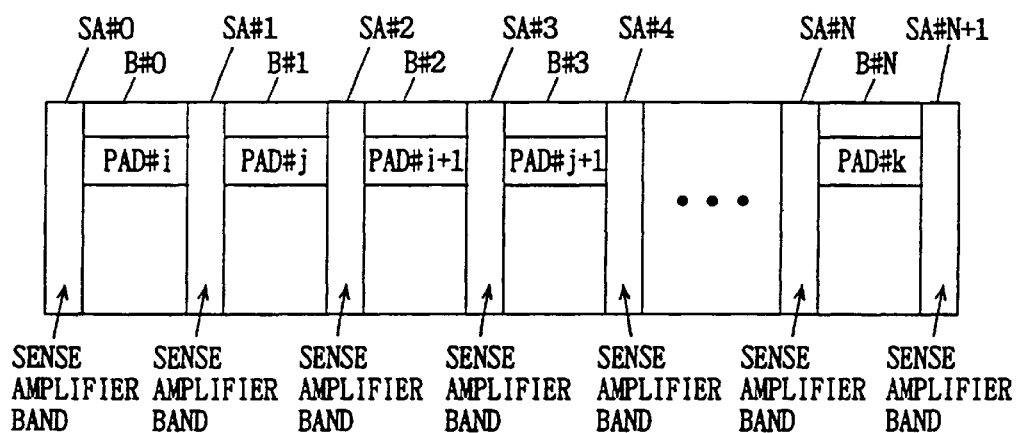
Figure 30B:
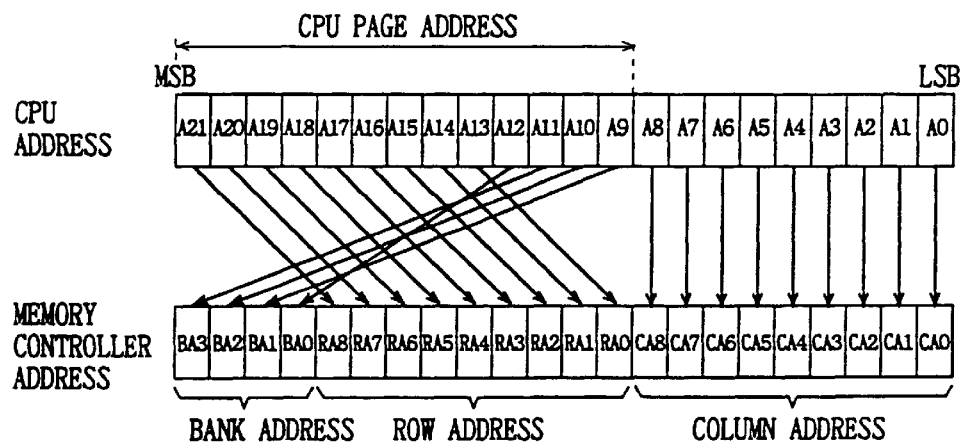
Figure 30C:
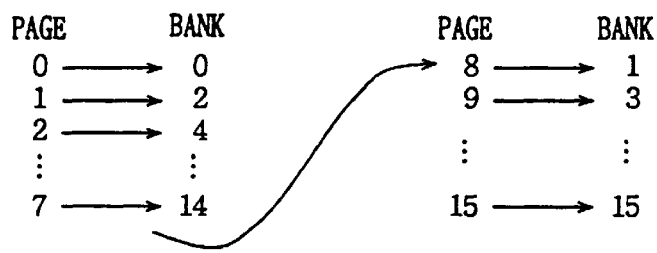
Figure 31A:
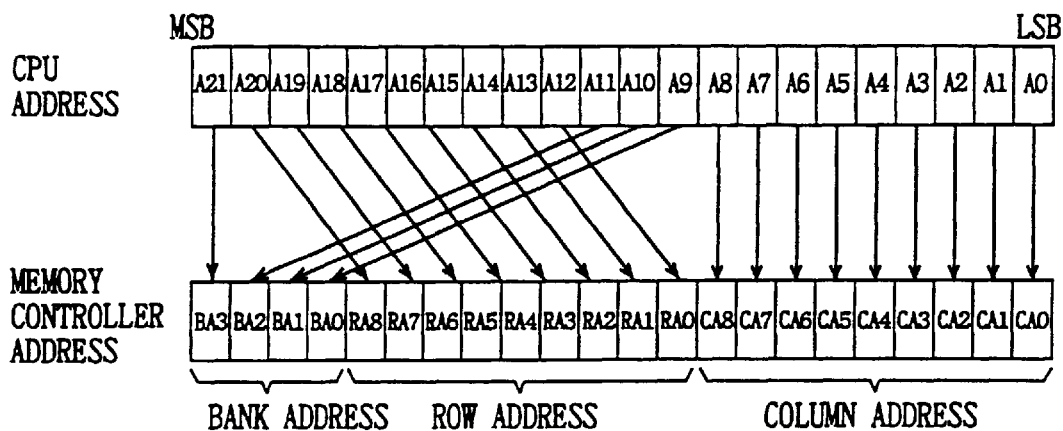
Figure 31B:
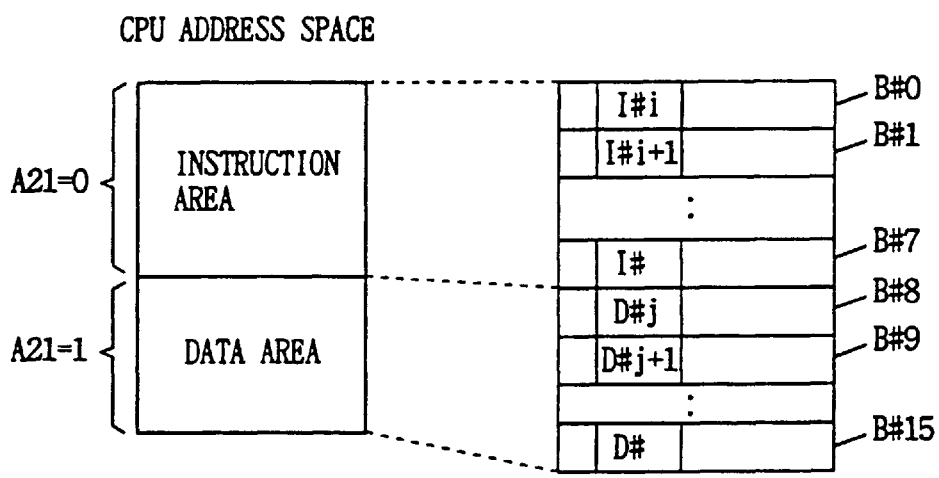
Figure 31C:
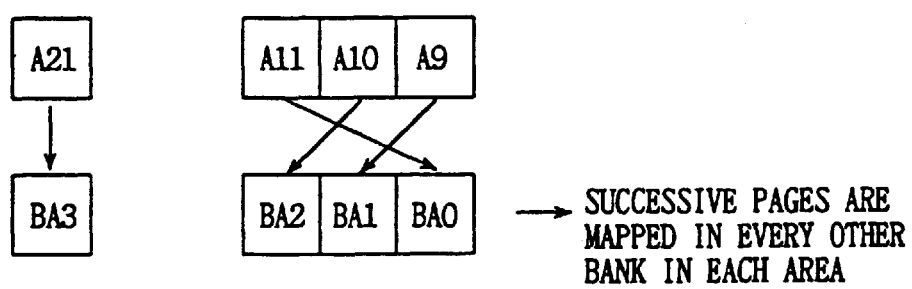
Figure 32:
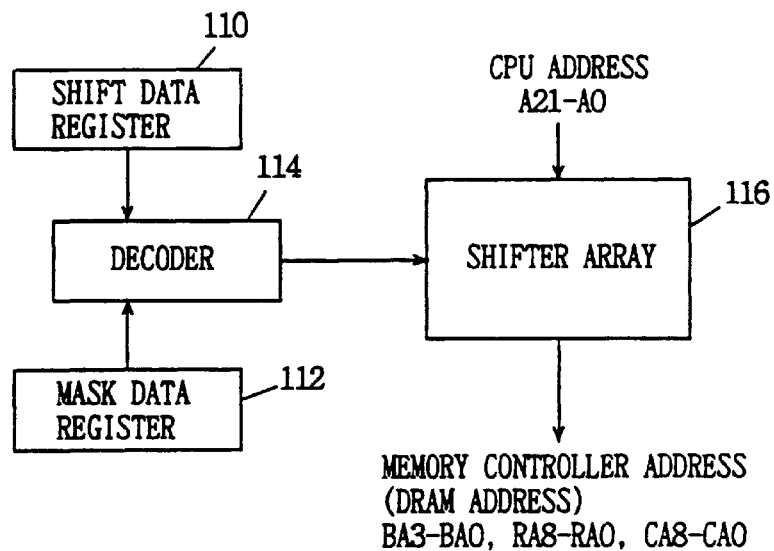
Figure 33:
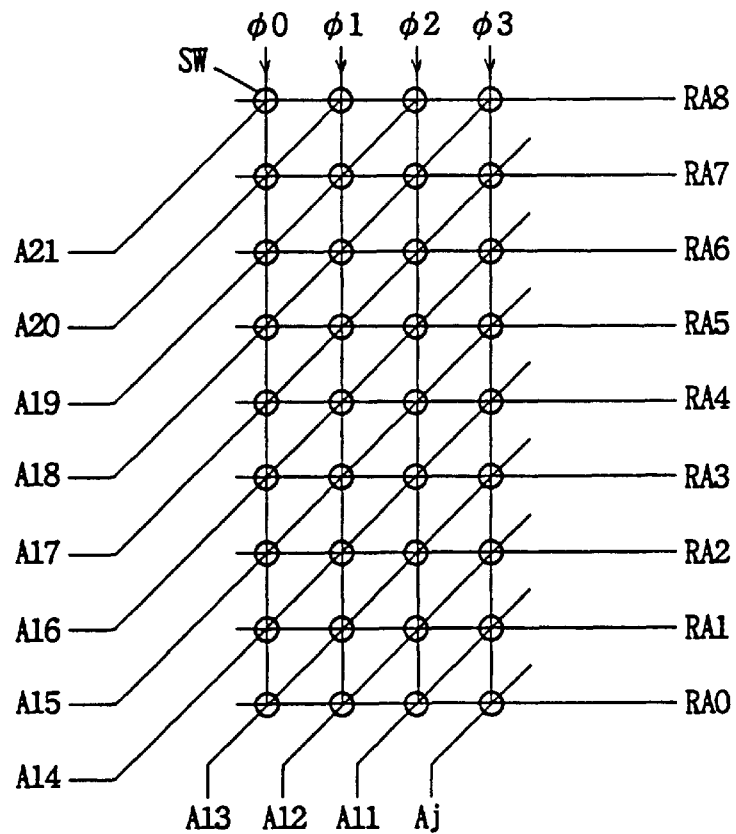
Figure 34:
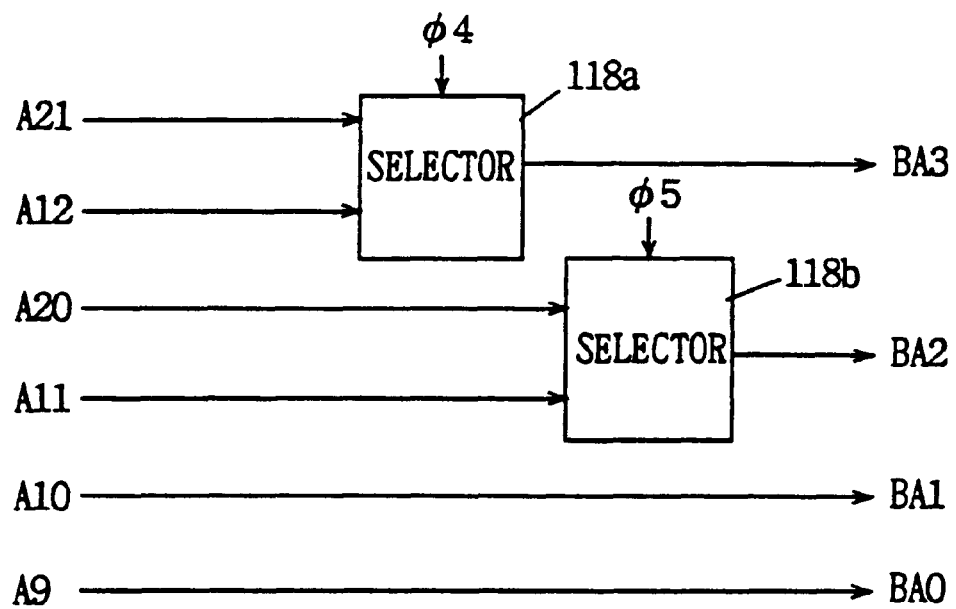
Figure 35:
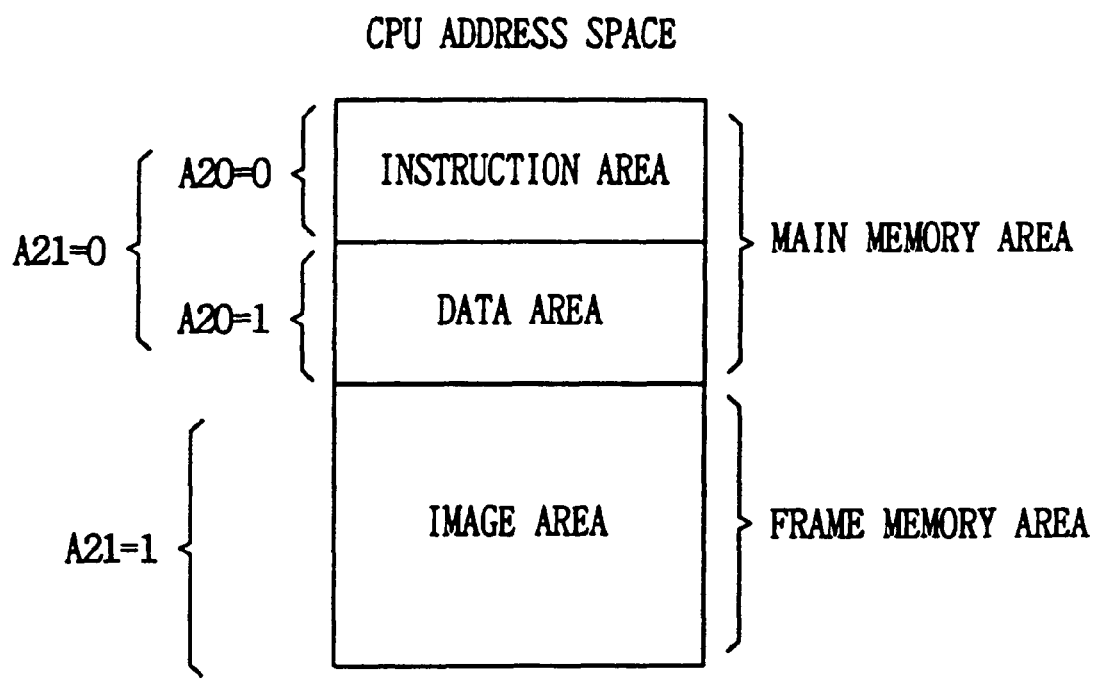
Figure 36A:
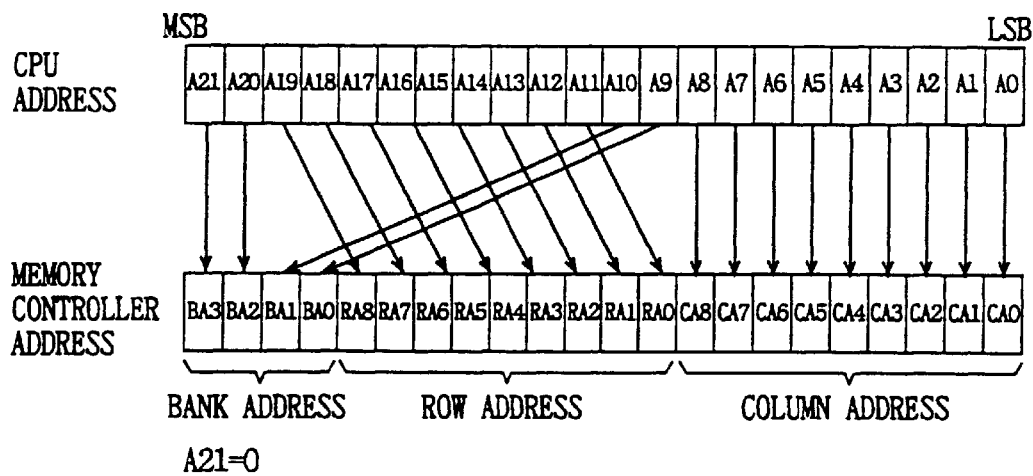
Figure 36B:
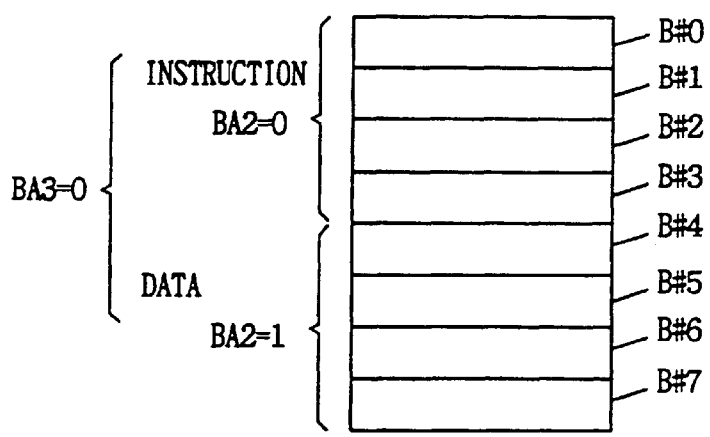
Figure 36C:
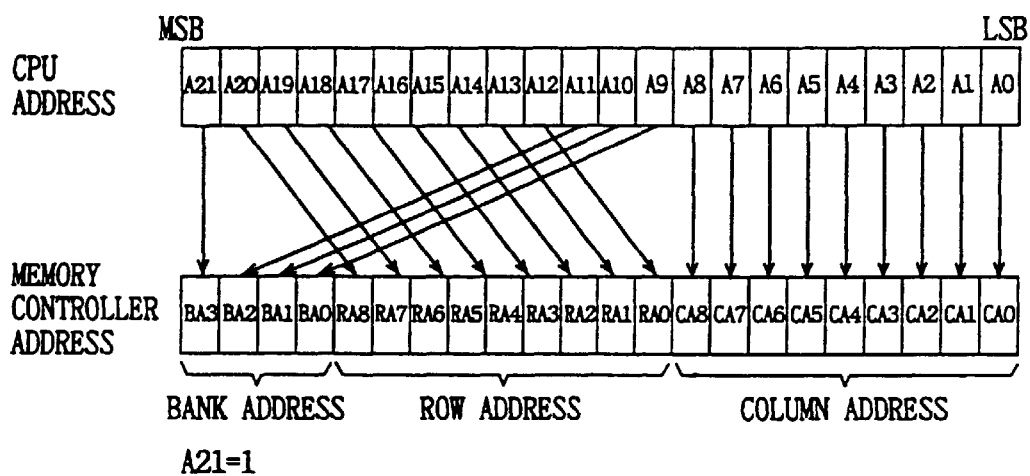
Figure 37:
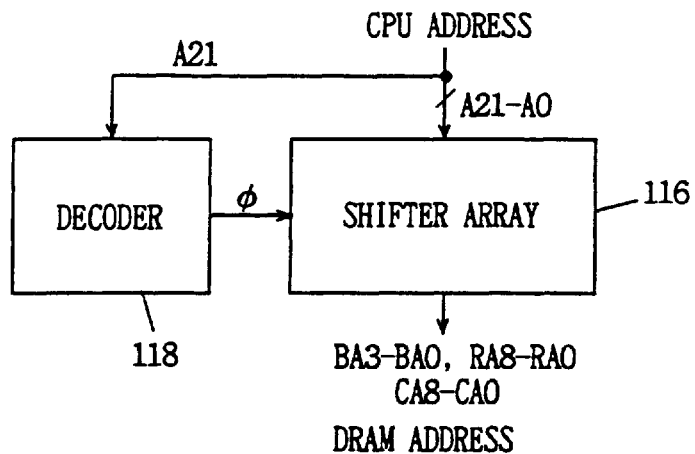
Figure 38:
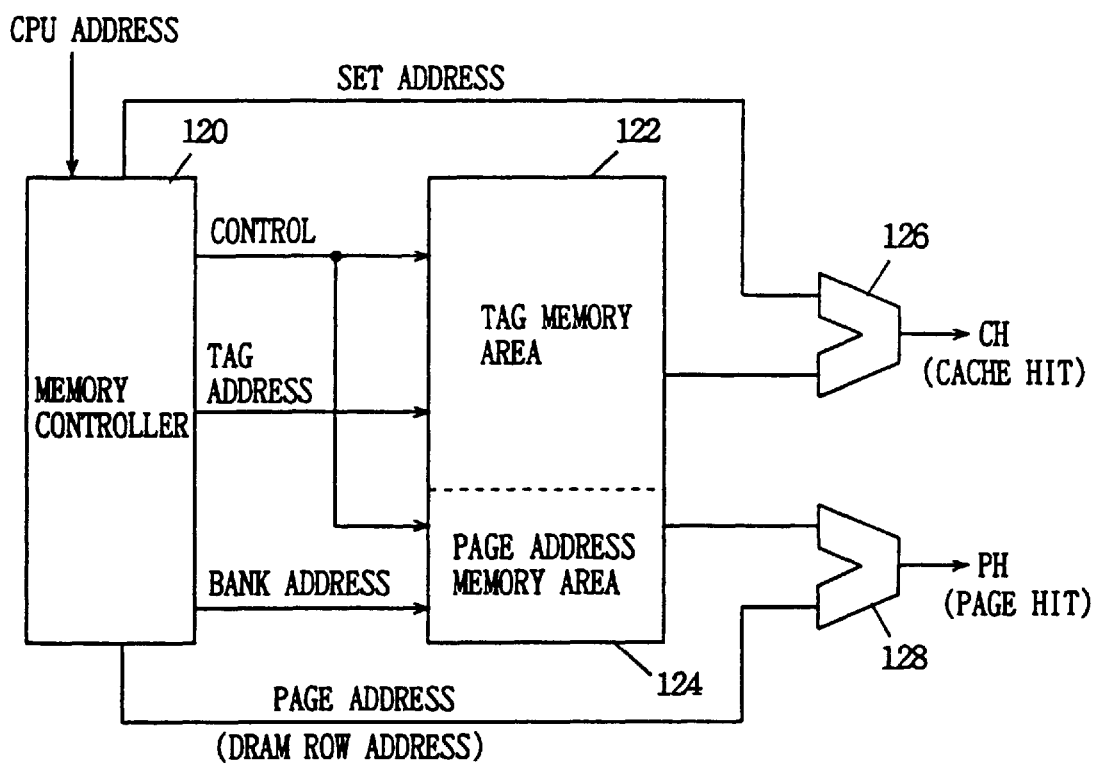
Figure 39A:
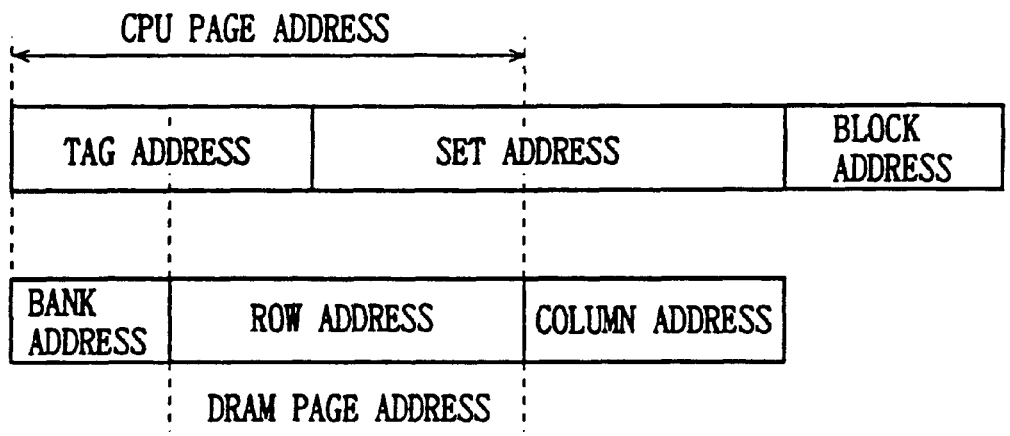
Figure 39B:
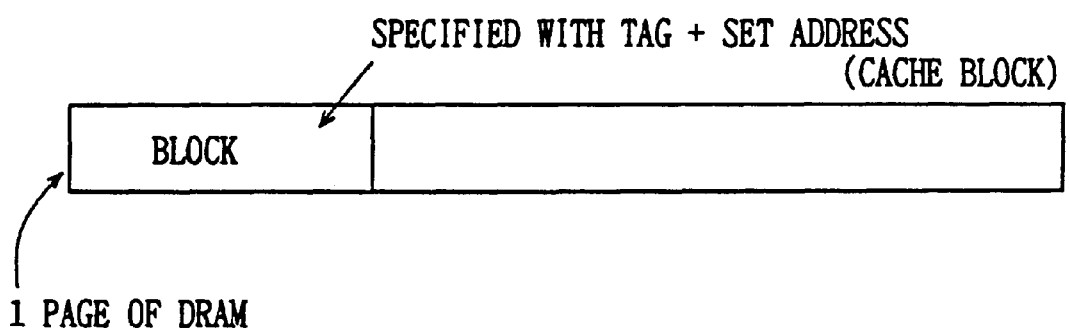
Figure 39C:
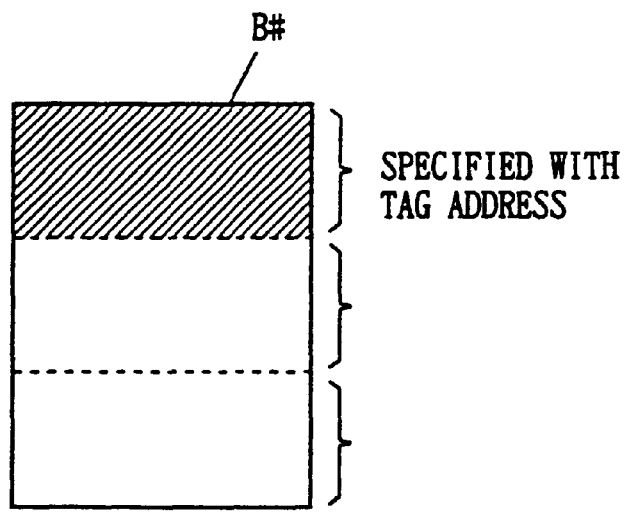
Figure 40:
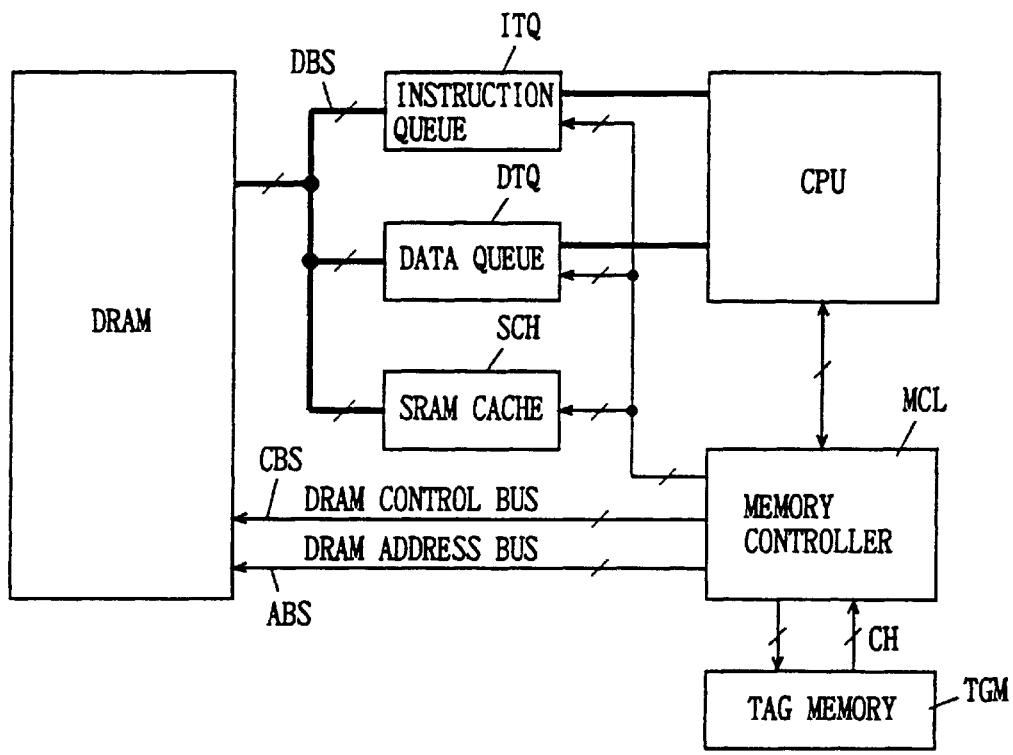
Figure 41:
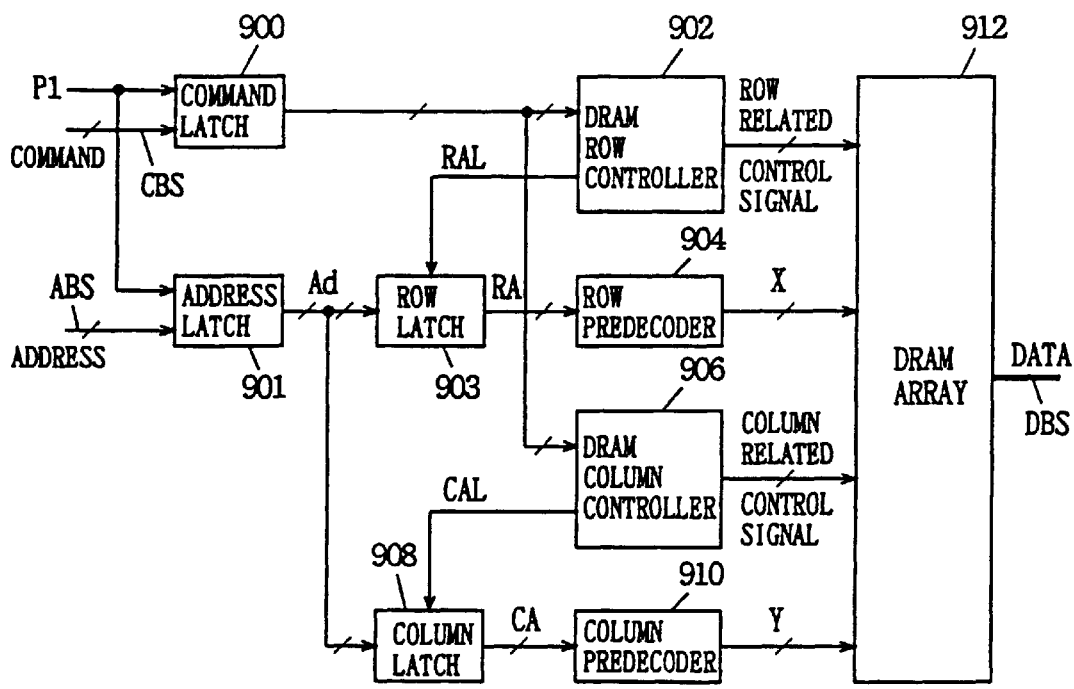
Figure 42A:
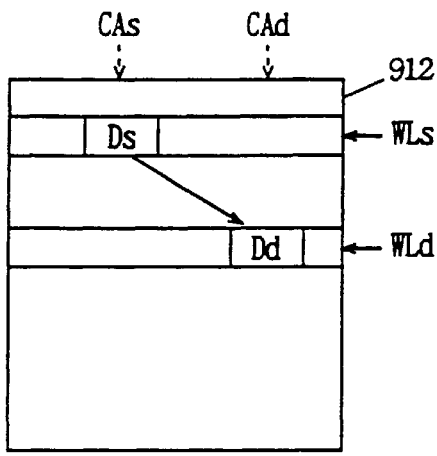
Figure 42B:
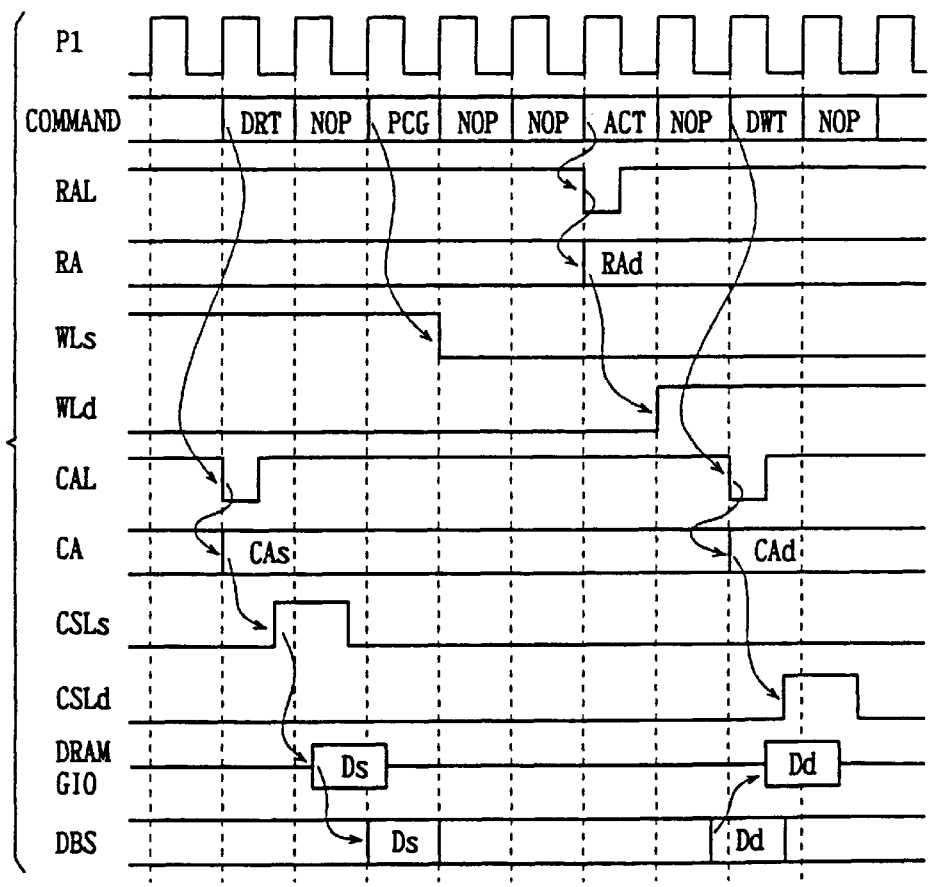

FIG. 4 schematically illustrates the structure of a control part of a DRAM according to an embodiment 2 of the present invention;

FIG. 5 schematically illustrates the structure of a row selection circuitry of the DRAM according to the embodiment 2 of the present invention;

FIG. 6 schematically illustrates the structure of a row decoder/driver part shown in FIG. 5;

FIG. 7 is a timing chart representing an operation of the row selection circuitry shown in FIG. 5;

FIGS. 8A, 8B and 8C illustrate the structures of a word line drive signal generation part shown in FIG. 6, a global driver part shown in FIG. 8A, and a local driver part shown in FIG. 8C respectively;

FIG. 9 schematically illustrates the structure of a principal part of a DRAM according to an embodiment 3 of the present invention;

FIG. 10 is a flow chart representing an operation of the DRAM according to the embodiment 3 of the present invention;

FIG. 11 schematically illustrates the structure of a tag memory part according to the embodiment 3 of the present invention;

FIG. 12 is a flow chart representing an operation of the DRAM according to the embodiment 3 of the present invention;

FIG. 13 schematically illustrates the structure of a control part of a DRAM according to an embodiment 4 of the present invention;

FIG. 14 schematically illustrates the structure of a refresh controller shown in FIG. 13;

FIG. 15 is a waveform diagram representing an auto refresh operation in the embodiment 4 of the present invention;

FIG. 16 is a waveform diagram representing a self refresh operation in embodiment 4 of the present invention;

FIG. 17 schematically illustrates the structure of a precharge status bit update part according to the present invention;

FIG. 18 is a flow chart representing the structure and operation of the precharge status bit update part shown in FIG. 18;

FIG. 19 schematically illustrates the structure of a memory controller part according to an embodiment 5 of the present invention;

FIG. 20 is a flow chart representing an operation of the memory controller shown in FIG. 19;

FIG. 21 schematically illustrates the structure of an address switching part of a memory controller part according to an embodiment 6 of the present invention;

FIG. 22 schematically illustrates an array structure of a DRAM according to the embodiment 6 of the present invention;

FIG. 23 schematically illustrates the structures of a memory block and a sense amplifier band shown in FIG. 22;

FIG. 24 schematically illustrates the structure of the sense amplifier band shown in FIG. 23;

FIG. 25 illustrates a memory block activation sequence according to the embodiment 6 of the present invention;

FIG. 26 schematically illustrates the structure of a control part for implementing the activation sequence shown in FIG. 25;

FIG. 27 is a flow chart showing an operation of the control part shown in FIG. 26;

FIGS. 28A to 28C illustrate address conversion modes in an embodiment 7 of the present invention;

FIG. 29 schematically illustrates a structure for implementing the address conversion shown in FIGS. 28A to 28C;

FIGS. 30A to 30C schematically illustrate address conversion modes in a modification of the embodiment 7 of the present invention;

FIGS. 31A to 31C illustrate address conversion modes in an embodiment 8 of the present invention;

FIG. 32 schematically illustrates the structure of an address conversion part in the embodiment 8 of the present invention;

FIG. 33 schematically illustrates the structure of a shifter array part sown in FIG. 32;

FIG. 34 schematically illustrates the structure of the shifter array part shown in FIG. 32;

FIG. 35 illustrates address mapping of a CPU address space in an embodiment 9 of the present invention;

FIGS. 36A to 36C illustrate address conversion modes in the embodiment 9 of the present invention;

FIG. 37 schematically illustrates a structure for implementing the address conversion modes shown in FIGS. 36A to 36C;

FIG. 38 schematically illustrates the structure of a memory control part according to an embodiment 10 of the present invention;

FIGS. 39A to 39C illustrate address correspondence of the address control part shown in FIG. 38;

FIG. 40 schematically illustrates the structure of a conventional processor having a built-in DRAM;

FIG. 41 schematically illustrates the structure of the DRAM shown in FIG. 40; and FIG. 42A illustrates a data transfer mode in the conventional processor having a built-in DRAM, and FIG. 42B is a timing chart showing a data transfer operation of the processor shown in FIG. 42A.

DESCRIPTION OF THE PREFERRED EMBODIMENTS

The present invention is directed to an improvement for a DRAM of a semiconductor integrated circuit device similar to that shown in FIG. 40 having a processor and the DRAM-integrated on a common semiconductor chip, and is also naturally applicable to a discrete DRAM.

[Embodiment 1]

Figure 1:
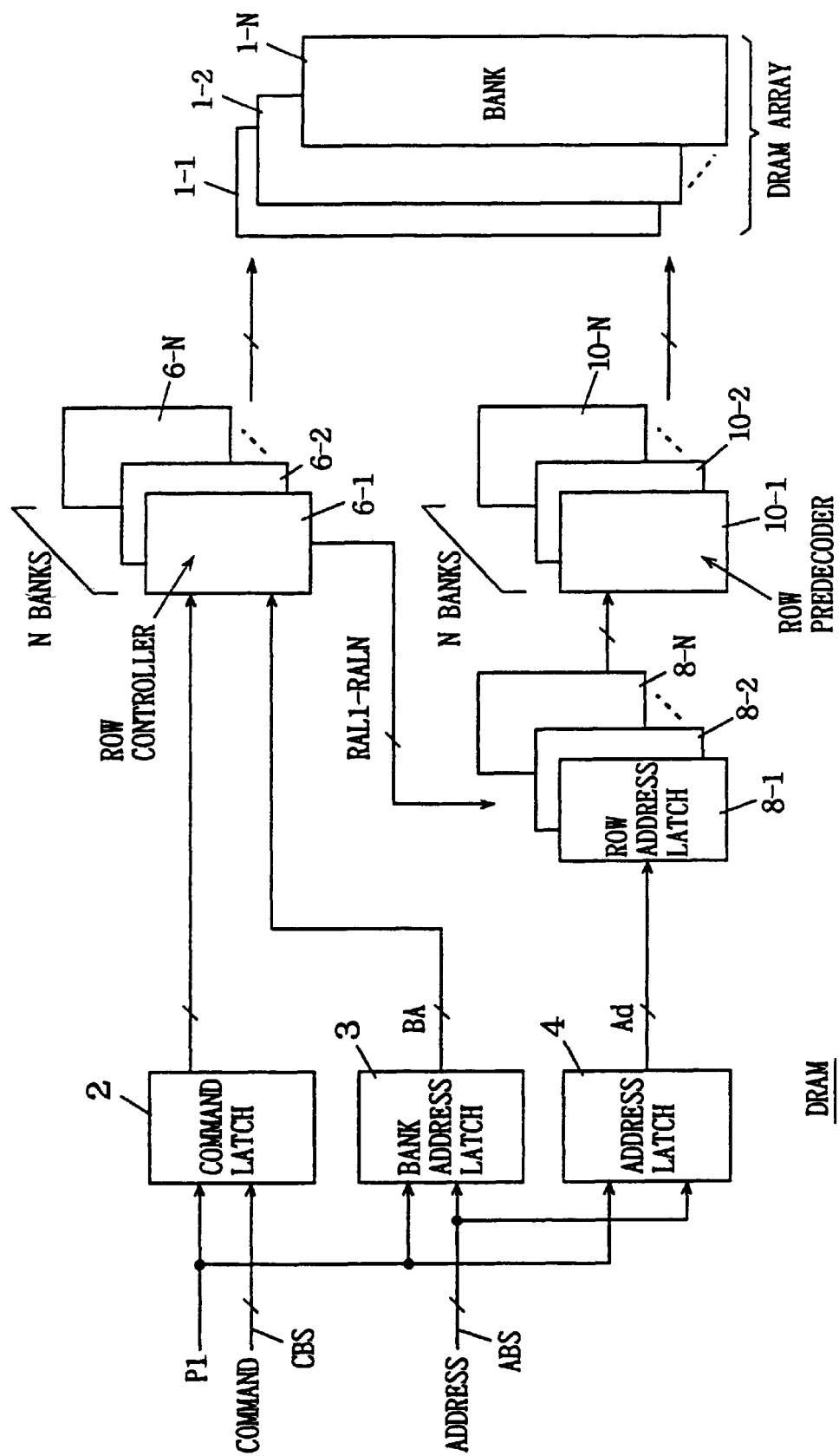

FIG. 1 schematically illustrates the overall structure of a DRAM as a semiconductor memory device according to the present invention. A processor (not shown) is formed on a common chip. Referring to FIG. 1, a DRAM array includes a plurality of (N) banks 1-1 to 1-N. Each of the banks 1-1 to 1-N includes a memory block having memory cells arranged in a matrix, and a peripheral circuit for driving a submemory block to a selected state.

The DRAM further includes a command latch 2 for latching a command (a combination of states of control signals) which is supplied from the exterior (from a memory controller) through a DRAM control bus CBS, a bank address latch 3 for latching a bank address included in an address signal which is supplied from the exterior (from the memory controller) through a DRAM address bus ABS in synchronization with a clock signal P1, and an address latch 4 for latching remaining address signals which are supplied in synchronization with the clock signal P1 through the DRAM address bus ABS. The bank address latch 3 outputs a bank address signal BA, and the address latch 4 outputs an internal address signal Ad. The bank address signal BA specifies one of the banks 1-1 to 1-N. The internal-address signal Ad specifies a row and a column in each of the banks 1-1 to 1-N.

The DRAM further includes row controllers 6-1 to 6-N which are provided in correspondence to the banks 1-1 to 1-N respectively and selected in accordance with the bank address signal BA for decoding a command supplied from the command latch 2 and outputting control signals for driving the corresponding banks to selected states and also outputting row address latch instruction signals RAL1 to RALN, row address latches 8-1 to 8-N which are provided in correspondence to the banks 1-1 to 1-N respectively and activated in accordance with the row address latch instruction signals RAL1 to RALN respectively for latching the address signal Ad supplied from the address latch 4, and row predecoders 10-1 to 10-N which are provided in correspondence to the banks 1-1 to 1-N respectively for predecoding row address signals supplied from the corresponding row address latches 8-1 to 8-N and outputting predecode signals.

The row address latches 8-1 to 8-N are brought into latch states when the corresponding row address instruction signals RAL1 to RALN are in active states. The row predecoders 10-1 to 10-N are activated in response to activation signals from the corresponding row controllers 6-1 to 6-N for performing predecoding operations. The row predecode signals from the row predecoders 10-1 to 10-N are supplied to row decoders (including word line drivers) provided in the banks 1-1 to 1-N respectively.

While no column selecting part is shown for simplifying the illustration, column address latches as well as column predecoders may be similarly provided in correspondence to the banks 1-1 to 1-N respectively, depending on the structure of the DRAM array. A column decoder may be provided in common for the banks 1-1 to 1-N. Data input/output parts of the respective banks 1-1 to 10N may be selectively activated in accordance with the bank address signal BA.

Figure 2:
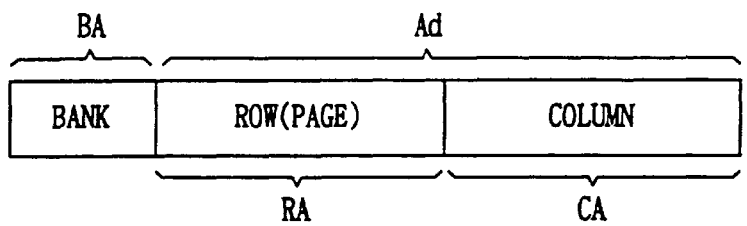
FIG. 2 illustrates an address structure of the DRAM according to the embodiment 1 of the present invention.

FIG. 2 illustrates the structure of an address signal. Referring to FIG. 2, the address includes the bank address BA specifying a bank, a row address RA specifying a row (page) in the bank, and a column address CA specifying a column in the bank. Rows (hereinafter simply referred to as pages) can be specified in each back independently of other banks by employing the bank address BA.

Figure 3:
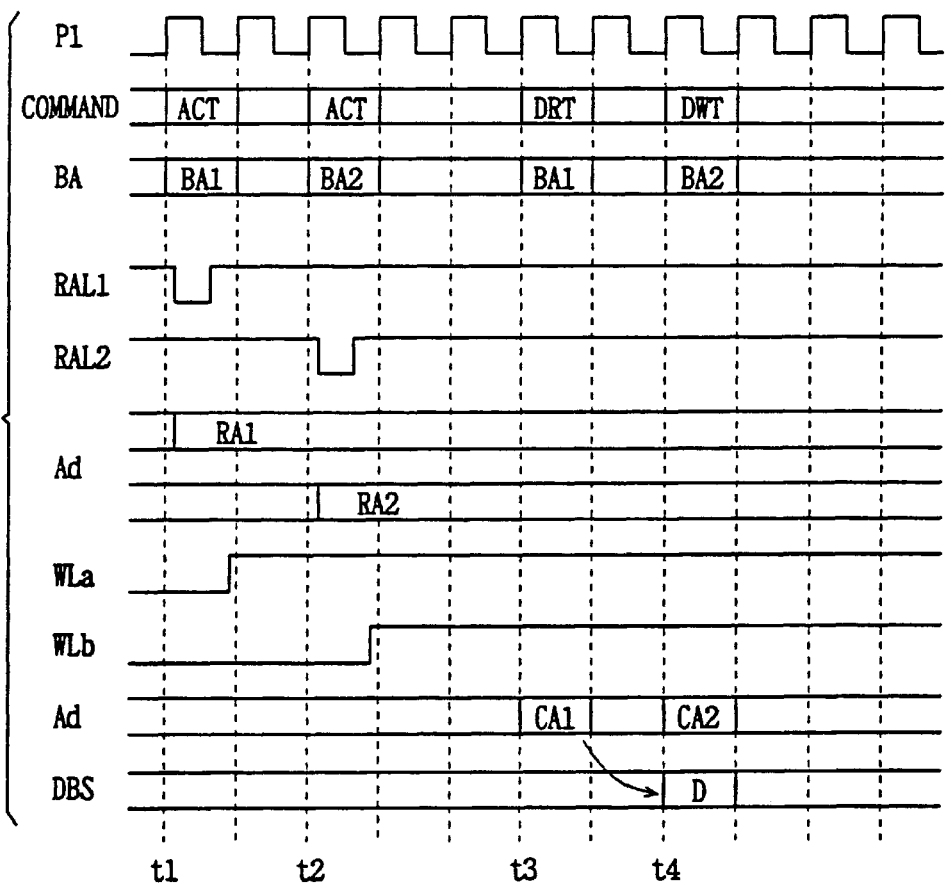
FIG. 3 is a timing chart representing an operation of the DRAM shown in FIG. 1.

FIG. 3 is a timing chart representing an exemplary operation of the DRAM shown in FIG. 1. Similarly to the operation shown in FIG. 42, FIG. 3 represents an operation in case of copying certain data of the DRAM array to a part of another page.

The data transfer operation is now described with reference to FIGS. 1 and 3.

At a time t1, an active command ACT is supplied together with the bank address BA. It is assumed that the bank address BA is an address BA1 specifying the bank 1-1. In this state, the row controller 6-1 provided in correspondence to the bank 1-1 is activated, and inactivates the row address latch instruction signal RAL1 for a prescribed period. Thus, the row address latch 8-1 is activated, for incorporating the address Ad from the address latch 4 and generating a row address signal RA1. In the bank 1-1, activation is made under control by the row controller 6-1, so that a word line WL1 is selected.

At a time t2, an active command ACT is supplied together with a bank address BA2. This bank address BA2 specifies the bank 1-2. In this state, the row controller 6-2 is activated, the row address latch instruction signal RAL2 is inactivated for a prescribed period, and the row address latch 8-2 is brought into a through state, for incorporating and latching the address signal Ad supplied from the address latch 8-2 and generating an internal row address signal RA2. In the bank 1-2, a memory block is activated under control by the row controller 6-2, so that a corresponding word line WL2 is selected.

In this state, therefore, the word lines WL1 and WL2 are selected in the banks 1-1 and 1-2 respectively, so that two-pages are selected in the DRAM.

An access request is supplied in accordance with a data transfer instruction from a CPU. The memory controller provided in the exterior determines a page hit/miss in accordance with the request from the CPU. In case of a page hit, the memory controller supplies a read command DRT together with the bank address BA1 and the column address CA1. A column controller (not shown) operates in the bank 1-1 to select a column in the bank 1-1, and outputs corresponding read data D on a data bus DBS.

At a time t4, the memory controller determines a page hit/miss in accordance with an access request from the CPU again. If a data transfer destination is on a position of the word line WL2, this is a page hit and the memory controller supplies a write command DWT of a data write instruction together with the bank address BA2 and the column address CA2. The data D on the data bus DBS is stored in a position of the bank 1-2 specified by the column address CA2 in accordance with the write command DWT supplied at the time t4.

In general, a column address is so structured as to specify a cache block, for simultaneously selecting data of a plurality of memory cells on a DRAM page. If a prescribed number of least significant address bits of a CPU address are neglected in accordance with a cache block size, data blocks each consisting of a plurality of bits can be simultaneously selected in the DRAM.

Referring to FIG. 3, a CAS latency (the number of clock cycles necessary for outputting valid data after supply of a read command) is set at 2. Therefore, the write command DWT is supplied after two clock cycles from supply of the read command DRT, whereby the data read on the data bus DBS is immediately written in the DRAM. Thus, the CPU need not store the data blocks in a general register through a data queue, whereby the data can be transferred at a high speed.

Due to the structure of a plurality of banks, a plurality of pages can be simultaneously selected in the. DRAM since the controllers can be activated in accordance with bank addresses BA in the respective banks independently of each other. Thus, the page hit rate can be improved, the CPU access time can be reduced, and the system performance can be improved. Particularly in case of performing a copy operation for transferring data from a page to another page in the DRAM, it is not necessary to perform a precharge operation (inactivation) and an active operation (activation) of the DRAM array when both of these pages are in page hit states, whereby a penalty in a cache miss can be reduced (necessary data can be read at a high speed), no precharge/ active operation (charge/discharge due to inactivation/ activation) is performed, and power consumption can be reduced.

[Embodiment 2]

FIG. 4 schematically illustrates the structure of a row selection related control part of a DRAM according to an embodiment 2 of the present invention. Referring to FIG. 4, a row related control circuit 6 includes a command decoder 60 for decoding a command supplied from the command latch shown in FIG. 1, a bank decoder 61 for decoding a bank address BA supplied from the bank address latch shown in FIG. 1 and generating a bank specifying signal, a global row controller 62 for generating required control signals in accordance with the result of the decoding from the command decoder 60, and bank row controllers 63-1 to 63-N with latches which are provided in correspondence to banks 12-1 to 12-N respectively and activated in response to the bank specifying signal from the bank decoder 61 for transmitting the control signals from the global row controller 62 to the corresponding banks and activating/ inactivating these banks.

The global row controller 62 generates the required control signals, such as a word line driving signal, a sense amplifier activation signal and a bit line precharge/equalize signal, in accordance with the decoding result (operation mode specifying signal) supplied from the command decoder 60. In the bank row controllers 63-1 to 63-N with latches, only that provided for the bank specified by the bank specifying signal from the bank decoder 61 is activated for driving the corresponding bank in accordance with the control signals from the global row controller 62.

As shown in FIG. 4, the control signals are generated in common for the banks 12-1 to 12-N in accordance with the decoding result from the command decoder 60 for selectively transmitting the control signals in accordance with the bank specifying signal from the bank decoder 61, whereby a circuit part required in common for the respective banks can be singularized, resulting in reduction of the circuit occupying area. The banks 12-1 to 12-N are driven independently of each other, and hence the bank row controllers 63-1 to 63-N with latches have functions of latching the outputs thereof, as the structures thereof are described later in detail. Thus, non-selected banks are not influenced when the global row controller 62 generates the control signals for driving any bank.

FIG. 5 schematically illustrates the structure of a row address generation part. Referring to FIG. 5, the row address generation part includes a row address latch 8 for latching a supplied address signal Ad in response to a row address latch instruction signal RAL, a row predecoder 10 for predecoding a row address RA supplied from the row address latch 8 in accordance with a row address decode enable signal RADE and generating predecode signals XA and XB, and row decoders/drivers 20-1 to 20-N which are provided in correspondence to the banks 12-1 to 12-N respectively for driving word lines (rows) of the corresponding banks in response to the predecode signals XA and XB supplied from the row predecoder 10 in accordance with a bank specifying signal RBS and a precharge signal (ZRDP including a bank specifying signal).

The row address latch 8 and the row predecoder 10 are provided in common for the banks 12-1 to 12-N, whereby the occupation areas thereof can be reduced. Since the row address latch 8 and the row predecoder 10 are provided in common for the banks 12-1 to 12-N, the row decoders/ drivers 20-1 to 20-N includes latch circuits for latching the decoding result, as described later in detail.

FIG. 6 illustrates an exemplary structure of each of the row decoders/drivers 20-1 to 20-N. FIG. 6 representatively shows a row decoder/driver 20-i (i=1 to N) provided for a prescribed number of word lines WL0, WL1, . . . of a bank 12-i.

Referring to FIG. 6, the row decoder/driver 20-i includes a row decode circuit part provided in common for a group of a prescribed number of word lines, and a word driver circuit part for driving each word line to a selected state in accordance with an output of the row decode circuit part and a word line drive signal.

The row decode circuit part includes a p-channel MOS transistor PQ1 which is connected between a high voltage VPP applying-node and a node Na and has a gate receiving a precharge instruction signal ZRDPi, and n-channel MOS transistors NQ1, NQ2 and NQ3 which are connected in series with each other between the node Na and a ground potential supply node. The predecode signals XA and XB from the row decoder 10 shown in FIG. 5 are supplied to gates of the MOS transistors NQ1 and NQ2 respectively. A row bank specifying signal RBSi is supplied to a gate of the MOS transistor NQ3.

The row decode circuit part further includes invertors IV1 and IV2 for latching a potential of the node Na, and an n-channel MOS transistor NQ4 for transmitting an output signal of the invertor IV1. The invertors IV1 and IV2 have outputs coupled to inputs of the invertors IV2 and IV1, respectively. The invertors IV1 and IV2 are driven by the high voltage VPP as a first operation source voltage. The MOS transistor NQ4 receives the high voltage VPP at its gate. This MOS transistor NQ4 prevents a boosted voltage resulting from a self bootstrap function of a MOS-transistor included in a driver from exerting bad influences on the invertors IV1 and IV2 when a word line driving signal RX is transmitted.

The word driver circuit part is provided in correspondence to each of the word lines WL0, WL1, . . . A word line driver for the word line WL0 includes an n-channel MOS transistor NQ5 for receiving a word line driving signal RXN0 and transmitting the same onto the word line WL0 in accordance with a signal potential from the MOS transistor NQ4, and an n-channel MOS transistor NQ6 which is connected between the word line WL0 and the ground potential supply node and has its gate connected to the node Na. A word line driver for the word line WL1 includes an n-channel MOS transistor NQ7 for transmitting a word line driving signal RXN1 to the word line WL1 in accordance with a signal potential transmitted from the MOS transistor NQ4 and an n-channel MOS transistor NQ8 for discharging the word line WL1 to the ground potential level in response to the signal potential on the node Na.

The number of the word lines simultaneously selected by the row decode circuit part is set at an appropriate number. The word line driving signals RXN0, RXN1, . . . are generated in accordance with a result of decoding of prescribed row address signal bits such as least significant two bits, as described later in detail. The word line driving signals RXN0, RXN1 . . . are at the high voltage VPP level (in activation).

FIG. 7 is a timing chart representing the operation of the row decoder/driver circuit 20-i shown in FIG. 6. With reference to FIG. 7, the operation of the row decoder/driver circuit 20-i shown in FIG. 6 is briefly described.

At a time t0, an active command ACT is supplied, and the bank address BA is set at an address BAi for specifying a memory bank 12-i. At this time, the row address RA is brought into a definite state, so that a predecode operation is performed. In accordance with the active command ACT and the bank address BAi, the bank specifying signal RBSi is brought into a high level of an active state. The precharge specifying signal ZRDPi maintains an inactive state of a high level. In this state, the MOS transistor PQ1 is in a nonconducting state, and the MOS transistor NQ3 conducts in response to the bank specifying signal RBSi. The address predecode signals XA and XB are brought into high levels of selected states due to a predecoding result of the row address RA which is brought into the definite state, whereby the node Na is discharged to the ground potential level through the MOS transistors NQ1 to NQ3.

The ground potential level potential on the node Na is inverted by the invertor IV1 to the high voltage VPP level, whereby the MOS transistor NQ5 is brought into a conducting state. The MOS transistor NQ6 enters a nonconducting state by the ground potential level potential on the node Na. The MOS transistor NQ7 is also brought into a conducting state, and the MOS transistor NQ8 is brought into a nonconducting state.

Any of the word line driving signals RXN0, RXN1, . . . is selectively activated in accordance with the row address RA and a global word line driving signal RXT described later. It is assumed here that the word line driving signal RXN0 is selected. In this state, the potential of the word line WL0 is brought into the high voltage VPP level in accordance with the word line driving signal RXN0. The word line WL1 is maintained at the ground potential level due to transmission of the word line driving signal RXN1 of the ground potential level of a non-selected state. Due to this operation, the word line WL0 is maintained in a selected state in the memory bank 12-i, so that data of a memory cell connected to the word line WL0 is sensed, amplified and latched by a sense amplifier (not shown).

At a time t1, an active command ACT and a bank address BAj are supplied again. This bank address BAj specifies a memory bank 12-j which is different from the memory bank 12-i. In this case, therefore, the bank specifying signal RBSi maintains a low level of an inactive state and the precharge instruction signal ZRDPi also maintains a high level, whereby the potential of the node Na is latched by the invertors IV1 and IV2 and maintains the ground potential level. Therefore, the word line WL0 in this memory bank 12-i maintains a selected state independently of array (memory block) activating operations in the remaining memory banks.

At a time t2, a precharge command PRG as well as a bank address BAi are supplied. In accordance with the precharge command PRG and the bank address BAi, the precharge instruction signal ZRDPi is brought into an active state of a low level for a prescribed period. The row bank specifying signal RBSi, which is activated in row selection, is in an inactive state of the ground potential level during precharging. Therefore, the MOS transistor NQ3 is in a nonconducting state, while the MOS transistor PQ1 conducts and the node Na is charged at the high voltage VPP level. Due to this charging of the node Na, an output signal of the invertor IV1 is brought into a low level of the ground potential level, and the MOS transistor NQ5 is brought into a nonconducting state. On the other hand, the MOS transistor NQ6 conducts and discharges the word line WL0 of a high voltage level to the ground potential level. The word line WL1 is also driven to the ground potential level by the MOS transistor NQ8.

At this time, the word line driving signal RXN0 is also discharged to the ground potential level indicating a non-selected state, as described later in detail.

As hereinabove described, the row decoder part is provided with the latch circuits (invertors IV1 and IV2) for latching the decoding result, whereby the row decoders/drivers 20-1 to 20-N can be driven independently of each other even if the predecode signals XA and XB are supplied to the row decoders/drivers 20-1 to 20-N provided for the memory banks 12-1 to 12-N respectively in common. Thus, a predecoder is shared, and a memory bank structure of a small occupying area can be implemented since the latches are small invertor latches.

FIGS. 8A to 8C illustrate the structure of a part for generating the word line driving signal RXN. Referring to FIG. 8A, the global row controller 62 includes an RXT generation circuit 62a for generating a timing signal RXT which is brought into an active state for a prescribed period in response to an array activation signal φACT supplied from the command decoder 60, and a global driver 62b for generating global word line driver signals RXF0 to RXF3 in accordance with row address bits RA0 and RA1 supplied from a row decoder and the timing signal RXT from the RXT generation circuit 62a.

The global driver 62b decodes the row address bits RA0 and RA1, and generates the global word line driver signals RXF0 to RXF3 in accordance with the results of the decoding. The global word line drive signals RXF0 to RXF3 are supplied to bank row controllers 63-1 to 63-N in common.

FIG. 8A representatively shows a bank controller 63-i which is provided for the memory banks 12-i. The bank controller 63-i includes a gate circuit 63-ia for receiving the array activation signal φACT and a corresponding bank specifying signal RBS supplied from the bank decoder 61 and generating the bank specifying signal RBSi, a gate circuit 63-ib for receiving an array precharge instruction signal φPRG supplied from the command decoder 60 and the bank specifying signal RBS supplied from the bank decoder 61 and generating the bank precharge instruction signal ZRDPi, and a local driver 63-ic for generating word line drive signals RXN0 to RXN3 in accordance with the bank specifying signal RBSi, the bank precharge instruction signal ZRDPi and the global word line drive signals RXF0 to RXF3. The local driver 63-ic has a latch function, and generates and latches the word line drive signals RXN0 to RXN3 supplied to the corresponding memory banks in accordance with the global word line drive signals RXF0 to RXF3 supplied from the global driver 62b in activation of the bank specifying signal RBSi.

FIG. 8B is a block diagram showing the structure of the global driver 62b shown in FIG. 8A. Referring to FIG. 8B, the global driver 62b includes a gate circuit 62ba for receiving the timing signal RXT and row address bits /RA0 and /RA1 and generating the global word line drive signal RXF0, a gate circuit 62bb for receiving the timing signal RXT and row address bits RA0 and /RA1 and generating the global word line drive signal RXF1, a gate circuit 62bc for receiving the timing signal RXT and row address bits/RA0 and RA1 and generating the global word line drive signal RXF2, and a gate circuit 62bd for receiving the timing signal RXT and row address bits RA0 and RA1 and generating the global word line drive signal RXF3. Each of these gate circuits 62ba to 62bd drives the corresponding global word line drive signal to a high level when the supplied signals are at high levels. In array activation, therefore, any one of the global word line driver signals RXF0 to RXF3 is brought into an active state of a high level, while the remaining three global word line driver signals are brought into low levels of non-selected states.

FIG. 8C schematically illustrates the structure of the local driver 63-ic shown in FIG. 8A. Referring to FIG. 8C, the local driver 63-ic includes a p-channel MOS transistor PQ2 which is connected between the high voltage VPP applying node and a node Nb and has a gate receiving the bank precharge instruction signal ZRDPi, and n-channel MOS transistors NQ9 and NQ10 which are connected in series with each other between the node Nb and a ground node. The MOS transistors NQ9 and NQ10 receive the global word line drive signal RXF0 and the bank specifying signal RBSi at gates thereof respectively.

The local driver 63-ic further includes an invertor IV3 for receiving a signal potential on the node Nb, an invertor IV4 for inverting the output of the invertor IV3 and transmitting the same to an input of the invertor IV3, an invertor IV5 for inverting the output of the invertor IV4, and an invertor IV6 for inverting the output of the invertor IV5. These invertors IV3 and IV6 are driven by the high voltage VPP as a first operating power source voltage. The circuit shown in FIG. 8C is also provided for each of the signals RXN1 to RXN3.

When a precharge command is supplied, the precharge instruction signal ZRDPi is brought into an active state of a low level, and a MOS transistor PQ2 enters a conducting state. At this time, the bank specifying signal RBSi is in an inactive state of a low level by the gate circuit 63-ia. Further, the MOS transistor NQ10 maintains a nonconducting state, and the node Nb is charged to the high voltage VPP level. Therefore, the word line drive signal RXN0 enters a low level of a non-selected state.

When an active command is supplied and the bank specifying signal RBSi is brought into a high level, the MOS transistor NQ10 enters a conducting state. At this time, the precharge instruction signal ZRDPi is in a nonconducting state. Therefore, the potential of the node Nb goes to the ground potential level when the global word line drive signal RXF0 is at a high level, while the node Nb maintains the high voltage VPP level if the global word line drive signal RXF0 is at a low level. Thus, the word line drive signal RXN0 enters the high voltage VPP level when the global word line drive signal RXF0 is at a high level, while the word line drive signal RXN0 is brought into a low level when the global word line drive signal RXF0 is at a low level. The potential on the node Nb is latched by the invertors IV3 and IV4.

The signals ZRDPi and RBSi are merely activated only for a prescribed period. Even if the global word line drive signal RXF0 is brought into a low level when the word line drive signal RXN0 is in an active state, therefore, the word line drive signal RXN0 maintains a selected state if the control signals ZRDPi and RBSi are in inactive states (when another memory bank is specified). Also when the word line drive signal RXN0 is in a non-selected state and the global word line RXF0 is brought into a high level, the word line drive signal RXN0 maintains a low level. This also applies to the remaining word line drive signals RXN1 to RXN3.

Also with respect to a bit line precharge/equalize instruction signal, the sense amplifier activation signal and the like, a common circuit part can be singularized similarly to the global/local circuit structure shown in FIGS. 8A to 8C, whereby the circuit occupying area can be remarkably reduced. A part for generating these signals has a structure similar to that shown in FIG. 8C. The signal RXF0 may be replaced with another row related control signal.

According to the embodiment 2 of the present invention, as hereinabove described, the row decoders are provided with the latch circuits for latching the decoding results, whereby the row address latch and the row predecoder can be provided in common for the memory banks, and the circuit occupying area can be reduced. Further, the control signal generation part is structured into a global/local circuit structure and the latch circuits are provided for the respective control signals in a local controller, whereby it is not necessary to provide a row related control circuit for each of the memory banks, and the circuit occupying area is reduced.

The number of the word lines simultaneously selected by the row decoder may not be four but an arbitrary number.

Further, each row decoder may have another structure, so far as the same has a function of latching a decoding result.

[Embodiment 3]

FIG. 9 illustrates the structure of a tag memory provided in the exterior of a DRAM. Referring to FIG. 9, this tag memory includes a page address memory 70 for storing page addresses for banks #1 to #N (corresponding to memory banks 12-1 to 12-N respectively) and a tag address memory 72 for storing tag addresses (addresses indicating cache blocks) for the respective banks. The area 70 for storing the page addresses is provided in the exterior of the DRAM, whereby an external memory controller provided on a common chip can identify a selected (most recently accessed) page in each bank even when each bank latches a decoding result and each bank controller has no function of latching a row address signal (page address), similarly to the embodiment 2.

The external memory controller maintains all banks of the DRAM in active states in start-up (power-on or system reset). In case of maintaining the respective banks in precharge states in power-on, a malfunction is caused if signal line potentials are set in erroneous states in the banks due to a noise or the like. Also in system reset, internal signal lines may not return to complete precharge states and a malfunction may be caused by incomplete precharge states if the respective banks are merely returned to precharge states.

Therefore, active commands are issued for all banks for maintaining all banks in active states and selecting a page in each bank, thereby reliably driving non-selected signal lines to non-selected states while driving the remaining signal lines to selected states. Thus, the signal lines are prevented from being held at erroneous potentials, and a malfunction is suppressed.

As shown in FIG. 10, the memory controller determines whether or not system start-up is specified (step S1), and activates all banks of the DRAM if the determination is of YES (step S2). The determination at the step S1 is made by a power-on detection signal and a system reset signal from a CPU. In case of successively activating the banks in start-up detection, a dedicated control sequence for the start-up is required. Namely, bank addresses are successively changed for activating the banks in the system start-up, and it is necessary to determine whether or not all banks are activated in this case. In auto refreshing, further, it is necessary to identify whether or not a bank to be refreshed is in active states. As shown in FIG. 11, therefore, an area 74 for storing a bit P/A indicating activation/inactivation for each bank is provided in an externally provided page address memory 70 or tag address memory 72. The activation/inactivation determination area 74 is set in a precharge state in the system reset. The bits P/A#1 to P/A#N of this area 74 may be set in precharge states through a hardware, or through a software under control by the memory controller. The precharge status bits P/A#1 to P/A#N are stored in the area 74, whereby it is possible to readily identify whether respective banks #1 to #N are in precharge states or active states. In access (including refresh instruction) to each bank, therefore, it is possible to determine whether an active command (or a refresh command) or a precharge command needs to be supplied to the corresponding bank. Therefore, control in system start-up and that in an ordinary operation mode can be implemented by a common sequence, whereby the structure of the control circuit and sequence control in start-up are simplified.

FIG. 12 is a flow chart representing a system startup sequence according to an embodiment 3 of the present invention. First, a determination is made as to whether or not system start-up is specified (step S10). If the determination is of YES, all bits P/A#1 to P/A#N of the precharge status area 74 are initialized to the state indicating the precharge state (step S11). After the detection of the system start-up, the memory controller successively searches the respective bits P/A#1 to P/A#N of the area 74, and first determines whether or not the first bit P/A is at an initial value (step S12). If the bit P/A is at an initial value, the memory controller determines that the corresponding memory bank is to be accessed first, and supplies an active command (step S13). In this case, a page address can be an arbitrary address.

After this bank activation, the memory controller resets the corresponding bit P/A of the area 74, to indicate an active state. Then, the memory controller determines whether all bits P/A of the area 74 are searched. This determination is made by successively incrementing the bank address numbers #1 to #N in the activation sequence and comparing the current address values with a maximum bank address value (step S15). If activation of all banks is completed and all bits P/A#1 to P/A#N of the area 74 are reset, the memory controller completes the initialization sequence. If activation of all banks is not completed at the step S15, on the other hand, the memory controller increments the bank address (Sl6), and returns to the step S12 again.

The precharge status bits P/A are provided for the respective banks and the values thereof are set at initial values in start-up, whereby it is readily identified that the first access to a memory bank is not an array precharge operation but array activation. Due to utilization of the precharge status bits P/A, the memory controller can recognize that the respective banks of the DRAM are in precharge states, and then supply an active command for correctly maintaining the respective banks in array activation states. In system start-up, therefore, it is not necessary to supply active commands to the respective banks after supplying precharge commands thereto for bringing the banks into precharge states or to supply precharge and active commands to the respective banks, whereby the control as well as operation upon the system start-up are simplified.

Due to the employment of the precharge status bits P/A, further, identification of bank activation/inactivation of banks sharing a sense amplifier band described later and control of bank activation are simplified and the precharge status bits P/A can be utilized also in an ordinary operation sequence, and access control is simplified.

Through the precharge status bits P/A, further, it is possible to readily identify whether a bank to be refreshed is in a precharge state or in an active state in auto refreshing, whereby issuance of an auto refresh command is simplified.

[Embodiment 4]

FIG. 13 illustrates the structure of a principal part of a DRAM according to an embodiment 4 of the present invention. Referring to FIG. 13, a command decoder 60 includes a command decoder 60a for receiving and decoding a self refresh command φSRF and an auto refresh command ARF. The command decoder 60a brings a self refresh instruction signal φSRF into an active state (high level) for a prescribed period when the self refresh command ZSRF is supplied, while bringing an auto refresh instruction signal WARF into a high level for a prescribed period when the auto refresh command ARF is supplied. In general, a processor having this DRAM is held in a "sleep state" of making no operation in a self refresh operation, whereby all signals forming the self refresh command ZSRF are held at low levels in case of supplying the command using specific signals. While the self refresh command ZSRF is in an active state of a low level, a self refresh operation is executed in the interior of the DRAM. The auto refresh command ARF is supplied by a combination of states of a plurality of signals.

A global row controller 62 includes a refresh controller 62c for performing control required in a refresh operation in accordance with the self refresh instruction signal φSRF and the auto refresh instruction signal WARF from the command decoder 60a, a timer 62d which is started in a self refresh operation for outputting self refresh requests at prescribed time intervals under control by the refresh controller 62c, and an address counter 62e for generating refresh addresses under control by the refresh controller 62c.

The address counter 62e generates both of refresh bank addresses and refresh row addresses (page addresses). The count value of the address counter 62e is incremented upon completion of a single refresh operation. The incrementation of the address counter 62e may be done such that the refresh addresses are so generated that respective pages are successively refreshed in a single bank and refreshing of the next bank is performed after all pages of the single bank are refreshed. Alternatively, common pages may be successively refreshed every bank.

The DRAM further includes a multiplexer 70 for selecting the refresh addresses from the address counter 62e in place of an address Ad and a bank address BA supplied from the memory controller in the refresh operation under control by the refresh controller 62c. An address and a bank address selected by the multiplexer 70 are supplied to an address latch 4 and a bank address latch 3 respectively.

FIG. 14 schematically illustrates the structure of the refresh controller 62c shown in FIG. 13. Referring to FIG. 14, the refresh controller 62c includes an OR gate 62e for receiving the auto refresh instruction signal φARF, the self refresh instruction signal φSRF and a refresh request signal φRFT from the timer 62d, a delay circuit 62f for delaying an output signal of the OR gate 62e by a prescribed period, an OR circuit 62g for receiving an output signal of the delay circuit 62f and an array activation instruction signal φACT, a delay circuit 62h for delaying an output signal φACTa from the OR circuit 62g by a prescribed time, and an OR circuit 62i for receiving output signals from the delay circuit 62h and the OR circuit 62e and a precharge instruction signal φPRG.

The signal MACTa from the OR circuit 62g and a signal φPRGa from the OR circuit 62i are employed in place of the array activation instruction signal φACT and the precharge instruction signal φPRG shown in FIG. 8A. The delay circuit 62f delays the supplied signal by a period corresponding to a time (RAS precharge time) necessary for precharging an array. The delay circuit 62h delays the activation signal φACTa for a time (RAS activation period (tRAS)) required for selecting a memory cell and driving a sense amplifier so that data amplified by the sense amplifier is written in the memory cell again. The delay circuits 62f and 62h may be formed by counters counting a clock signal (P1). If the delay circuits 62f and 62h are formed by counters and supplied signals are activated, the counters are started to output count-up signals of active states when prescribed count values are counted.

The global row controller 62c further includes a delay circuit 62j for further delaying an output signal of the delay circuit 62h by a prescribed time. An output signal φPPA from the delay circuit 62j provides a timing for changing each precharge status bit P/A in self refreshing, as described later. Therefore, the delay circuit 62j may be activated only in a self refresh operation mode. If the auto refresh command is issued when a refresh bank is in a precharge state as shown in the aforementioned embodiment 3, the signal φACTa may be immediately activated in auto refreshing.

FIG. 15 is a timing chart indicating the auto refresh operation of the structure shown in FIGS. 13 and 14. The auto refresh operation is now described with reference to FIG. 15.

When the auto refresh command ARF is supplied, the auto refresh instruction signal φARF from the command decoder 60a is brought into an active state of a high level for a prescribed period. In accordance with the auto refresh instruction signal φARF, the precharge instruction signal φPRGa is activated for a prescribed period through the OR circuits 62h and 62i.

On the other hand, the refresh controller 62c instructs the multiplexer 70 to select the count value of the address counter 62e in accordance with the auto refresh instruction signal φARF. Therefore, a refresh address is supplied to the address latch 4 and the bank address latch 3 through the multiplexer 70. A precharge operation is performed on a bank (refresh bank) to be refreshed in accordance with the refresh bank address. Namely, a word line which has been in a selected state is driven to a non-selected state in the refresh bank. The remaining non-refresh banks maintain array activation states. After a lapse of the delay time tRP of the delay circuit 62f, the array activation signal φACTa of the OR circuit 62g is activated for a prescribed period. Also in this state, the bank address latch 3 and the address latch 4 latch refresh addresses. In accordance with the refresh address, therefore, a page (word line WL) is newly driven to a selected state in the refresh bank.

During the delay time (tRAS) of the delay circuit 62h, a memory cell of a page specified by the refresh address is refreshed. When this refreshing is completed, an output signal of the delay circuit 62h is brought into an active state of a high level, and the precharge activation signal φPRGa outputted from the OR circuit 62i is activated for a prescribed period again. A precharge operation is performed in response to the activation of the precharge activation signal φPRGa, so that the refreshed page is driven to a non-selected state and the refresh bank returns to a precharge state. When a series of these operations is completed, the refresh controller 62c updates the count value of the address counter 62e.

The auto refresh command ARF is supplied through the aforementioned operation, whereby the refresh bank is successively precharged, refreshed and precharged in the DRAM. In this case, however, the precharge status bit P/A is not referred to in the auto refresh operation. In case of referring to the bit P/A, page selection is performed immediately after the auto refresh instruction.

FIG. 16 is a timing chart representing a self refresh operation of the structure shown in FIGS. 13 and 14. With reference to FIGS. 13, 14 and 16, the self refresh operation is now described.

When the self refresh command ZSRF (low-level signal) is supplied, the command decoder 62a brings the self refresh instruction signal φSRF into an active state of a high level for a prescribed period. The refresh controller 62c starts the timer 62d in response to the activation of the self refresh instruction signal φSRF. The OR circuit 62e outputs a signal entering an active state for a prescribed period in response to the activation of the self refresh instruction signal φSRF, whereby the array precharge signal φPRGa from the OR circuit 62i is brought into a high level of an active state for a prescribed period.

Also in the self refresh operation, the refresh controller 62c controls the address counter 62e and the multiplexer 70, and makes the address latch 4 and the bank address latch 3 latch a refresh address and a refresh bank address respectively. Due to the activation of the array precharge signal φPRGa, therefore, refreshing of the page (word line) in the refresh bank which has been refreshed and in a selected state is driven to a non-selected state.

Similarly to the auto refresh operation, the array activation signal φACTa is brought into a high level of an active state for a prescribed period after a lapse of the delay time of the delay circuit 62f, whereby page selection and refreshing are executed in accordance with the refresh address and the refresh bank address.

The output signal of the delay circuit 62h rises to a high level, whereby the array precharge signal φPRGa from the OR circuit 62i is brought into an active state of a high level again, so that the refresh page is driven to a non-selected state. Then, the output signal φPPA of the delay circuit 62j is activated, so that the precharge status bit P/A of the refresh bank is set in a state indicating a precharge state as described later in detail.

Then, the timer 62d counts up a prescribed time, and the refresh request signal φRFT is brought into a high level of an active state for a prescribed period. Thus, the array activation signal φACTa is activated for a prescribed period again. The count value of the address counter 62e is updated after completion of the self refresh operation. Therefore, the precharge operation, the array activation and the array precharge operation are repeated again in accordance with the next refresh address and the next refresh bank address, in response to the newly generated array activation signal φACTa. After completion of the precharge operation, the count value of the address counter 62e is updated again. Thereafter the refresh operation is repetitively executed while the self refresh instruction command ZSRF is in an active state, so that the precharge status bit P/A of the refresh bank is set in a precharge state every refresh operation.

FIG. 17 schematically illustrates the structure of a precharge status bit control part 78. Referring to FIG. 17, the precharge status bit control part 78 includes a command decoder 78a for decoding a command supplied from the memory controller, a data set circuit 78b for setting data in accordance with a command decoding result from the command decoder 78a, a read/write control circuit 78c for controlling reading/writing of bits from/in a memory area 74, a bank decoder 78d for decoding a bank address BAa supplied from the bank address latch 3 under control by the read/write control circuit 78c, and a bit selector 78e for selecting a corresponding bit position of the memory area 74 under control by the read/write control part 78c in accordance with an output signal from the bank decoder 78d.

The command decoder 78a determines whether a supplied command is a self refresh command, an auto refresh command, a precharge command or an active command. The data set circuit 78b sets the bit at a value ("0") indicating a precharge state when a precharge, auto refresh or self refresh command is supplied, while setting data at a value ("1") indicating an active state when an active command is supplied. The DRAM, the processor and the memory controller are integrated on a common chip, whereby no problem is caused in particular even if the bank address BAa from the bank address latch 3 of the DRAM is transmitted to the bit control part 78.

The read/write control part 78c writes data in the memory area 74 in accordance with the signal φPPA from the delay circuit 62j shown in FIG. 14 when the command decoder 78a specifies a self refresh mode. At this time, the bank decoder 78d and the bit selector 78e also execute operations under control by the read/write control part 78c in response to the signal φPPA. The operation of the precharge status bit control part 78 shown in FIG. 17 is now described with reference to a flow chart of FIG. 18 representing showing the operation.

The command decoder 78a determines whether or not a supplied command is a self refresh command specifying a self refresh mode (step S20). If a self refresh command is supplied, the read/write control circuit 78c selects the signal φPPA as a trigger signal specifying a timing for writing a status bit in the memory area 74 (step S21). If a command other than a self refresh command is supplied, on the other hand, the read/write control circuit 78c selects the timing supplying the command as a trigger signal defining the timing for reading/writing the precharge status bit from/in the memory area 74 in accordance with an output signal from the command decoder 78a (step S22). After this timing is decided, a determination is made as to whether or not the supplied command is an active command (step S23). If supply of an active command is determined at the step S23, data "1" indicating an active state is set at the data set circuit 78b (step S24).

If supply of a command other than an active command, i.e., a precharge command or an auto refresh command is determined at the step S23, or supply of a self refresh command is determined at the step S20, on the other hand, data "0" indicating a precharge state is set at the data set circuit 78b (step S25). After the steps S24 and S25, a trigger signal is supplied and the read/write control part 78c activates the bank decoder 78d and the bit selector 78e, selects a corresponding bit position (entry) in the memory area 74, and writes the data set by the data set circuit 78d in the selected entry (step S26).

As hereinabove described, the value of the corresponding precharge status bit P/A can be set at a bit value corresponding to the state of the bank depending on whether the bank is specified in an ordinary operation mode or a refresh operation mode.

In this DRAM, all banks are selected in general. Namely, a sense amplifier is utilized as a pseudo cache in each bank, thereby improving the page hit rate and reducing a penalty in a cache miss/page hit. When the refresh bank is maintained in a precharge state after the refreshing as described above and this refresh bank is page hit on the basis of a page address of a page address memory, it is possible to identify whether or not an active command is to be supplied next by observing the value of the precharge status bit P/A, whereby a page hit/miss can be correctly determined. Also in case of a page miss/cache miss, it is possible to readily identify whether a command to be issued first for the access-requested bank is a precharge command or to be an active command by observing the value of the precharge status bit P/A.

The refresh bank simply maintains the precharge state after completion of the refresh operation, whereby a refresh operation sequence of the memory controller is simplified. Also in a multi-bank structure, each page can be reliably refreshed in a prescribed cycle.

[Embodiment 5]

FIG. 19 schematically illustrates the structure of a refresh control part of a memory controller 90 according to an embodiment 5 of the present invention. Referring to FIG. 19, the memory controller 90 (MCL) includes a timer 90a for counting a clock (P1) and outputting a refresh request signal at a prescribed timing, a refresh controller 90b for making control which is necessary for a refresh operation in accordance with the refresh request signal from the timer 90a, and a command generation part 90c for generating a command under control by the refresh controller 90b. The command generation part 90c outputs a necessary command also to the precharge status bit control part 78 shown in FIG. 17. The operation of the memory controller 90 shown in FIG. 19 is now described with reference to an operation flow chart of FIG. 20.

The timer 90a counts the clock signal (P1) (not shown), and outputs the refresh request signal every prescribed count value. The refresh controller 90b determines whether or not a refresh request signal is supplied from the timer 90a (step S30). When the refresh request signal is supplied from the timer 90a, the refresh controller 90b makes the command generation part 90c generate an auto refresh command and supplies the same to a DRAM (step S31). The DRAM performs an auto refresh operation.

The refresh controller 90b issues a command through the command generation part 90c, to read a page address of a refresh bank from a page address memory area (step S32). When the DRAM completes the auto refresh operation and the refresh bank returns to a precharge state, the refresh controller 90b supplies an active command to the command generation part 90c. Along with the active command, the page address read from the page address memory area and a refresh bank address BAa (see FIG. 13) read from the DRAM are supplied to the DRAM. Thus, a page which has been in a selected state before the refreshing is selected again in the DRAM (step S34).

FIG. 21 illustrates a structure for activating the refresh bank again by the page address from a page memory area 70. Referring to FIG. 21, a latch 81 latches the bank address BAa from the DRAM under control by the refresh controller 90b, or in response to a signal φL. A selector 82a selects either the bank address BAa latched by the latch 81 or a bank address BA supplied from the memory controller 90 in accordance with a control signal φSEL from the refresh controller 90b, and supplies the address to a DRAM bank address latch. A selector 82b selects either a page address Ad(P) read from the page memory area 70 or an address Ad(R) supplied from the memory controller 90 in accordance with the selection signal φSEL supplied from the refresh controller 90b and supplies the selected one to a DRAM address latch.

In accordance with a read/write control signal R/W supplied from a read controller, the read/write circuit 80 reads a corresponding page address from the page memory area 70 with the use of the bank address BAa supplied from the latch 81 and supplies the same to the selector 82b. The read/write circuit 80 is utilized also in reading and updating of a page address from the page memory area 70 in determination of a page hit/miss. In the page hit/miss determination, a bank address supplied from the memory controller 90 is supplied in place of that from the latch 81. Thus, the device scale is not increased and the refresh bank can be returned to the state before refreshing also in completion of the refreshing. A page is regularly selected in each bank, whereby reduction of the page hit rate by an auto refresh operation can be suppressed.

According to the embodiment 5 of the present invention, as hereinabove described, the refresh bank is returned to the state before refreshing again after completion of the auto refresh operation, whereby reduction of the page hit rate caused by the auto refresh operation can be suppressed.

[Embodiment 6]

FIG. 22 schematically illustrates the structure of an array part of a DRAM according to an embodiment 6 of the present invention. Referring to FIG. 22, the DRAM includes a plurality of memory blocks M#0 to M#N, sense amplifier bands SA#1 to SA#N which are arranged between these memory blocks M#0 to M#N, sense amplifier bands SA#0 and SA#N+1 which are provided in the outer side of the memory blocks M#0 and M#N respectively, and local bank drive circuits R#0 to R#N which are provided in correspondence to the memory blocks M#0 to M#N respectively.

Each of the memory blocks M#0 to M#N has a plurality of dynamic memory cells arranged in a matrix. The sense amplifier bands SA#0 to SA#N+1 include sense amplifier circuits which are provided in correspondence to respective columns of the corresponding memory blocks. The sense amplifier circuits sense and amplify potentials on the columns of the corresponding memory blocks when activated. The sense amplifier bands SA#1 to SA#N arranged between the memory blocks M#0 to M#N are shared by corresponding adjacent memory blocks respectively. The local bank drive circuits R#0 to R#N include sense amplifier controller circuits, row decoders and word line drive circuits respectively, for implementing activation/inactivation of the corresponding memory blocks M#0 to M#N in accordance with control signals from a local bank controller.

The DRAM further includes a column decoder 100 which is provided in common for the memory blocks M#0 to M#N, a bank selection circuit 102 for connecting the memory blocks M#0 to M#N to a global I/O bus GIOB in accordance with a bank selection signal ABA, and a read/write circuit 104 for inputting/outputting data between the global I/O bus GIOB and the exterior of the DRAM. The global I/O bus GIOB is arranged in common for the memory blocks M#0 to M#N, and transfers data between the same and a selected bank (memory block).

The column decoder 100 is provided in common for the memory blocks M#0 to M#N, and a column selection signal from the column decoder 100 is transmitted onto a column selection line CSL (not shown). Therefore, the column selection line CSL is arranged to extend over the memory blocks M#0 to M#N. The column decoder 100 is activated when a read or write command is supplied. The bank specifying signal φBA supplied to the bank selection circuit 102 is generated in accordance with a bank address when a read or write command is supplied. Therefore, the bank selection circuit 102 connects a selected bank to the global I/O bus GIOB only when data is read/written. The read/write circuit 104 is activated when a read or write command is supplied.

In the array arrangement shown in FIG. 22, a single bank is formed by a memory block and a corresponding local bank drive circuit. The sense amplifier bands SA#1 to SA#N are shared by the adjacent ones of the memory blocks (memory banks), and hence the adjacent memory blocks cannot be simultaneously selected. Therefore, each pair of adjacent memory blocks (memory banks) one is in an active state and the other is a precharge state (inactive state) respectively. Identification of active/inactive states of the memory banks is managed by precharge status bits P/A described in the above embodiment.

FIG. 23 schematically illustrates the structure of a memory block M#n of the memory array shown in FIG. 22. The memory block M#n includes word lines WLn0 to WLnM each connected with a row of memory cells, and bit line pairs BLn1 and /BLn1, BLn2 and /BLn2, BLn3 and /BLn3, BLn4 and BLn4 . . . each connected with a column of memory cells. A first bit line of each pair of bit lines is arranged between the adjacent bit line pair. For example, the bit line BLn2 is arranged between the adjacent pair of bit lines BLn1 and /BLn1. The pitches of the bit line pairs are so widened as to increase the pitches of the sense amplifiers and ensure arrangement areas thereof.

The even numbered bit line pairs BLn2 and /BLn2, BLn4 and /BLn4, . . . of the memory block M#n are connected to sense amplifier circuits SAa1, SAa2, . . . through isolation gates BTGn1, BTGn2, . . . conducting by a bit line isolation signal BLI2n. On the other hand, the odd numbered bit line pairs BLn1 and /BLn1, BLN3 and /BLn3, . . . are connected to sense amplifier circuits SAb1, SAb2, . . . through bit line isolation gates BTGn1, BTGn3, . . . conducting in response to a bit line isolation signal BLI2+1.

The sense amplifier circuits SAa1, SAa2, . . . are connected to even or odd numbered bit line pairs BLa1 and /BLa1, BLa2 and /BLa2, . . . of an adjacent memory block M#(n−1) through bit line isolation gates BTGa1, BTGa2, . . . The sense amplifier circuits SAb1, SAb2, . . . are connected to bit line pairs BLb1 and /BLb1, BLb2 and /BLb2, . . . of another memory block M#n+1 through bit line isolation gates BTGb1, BTGb2, . . . conducting in response to a bit line isolation signal BLI2n+2.

The memory blocks M#(n−1), M#n and M#(n+1) each form a memory bank which is driven independently of others. When the memory block M#n is in an active state, the bit line isolation signals BLI2n and BLI2n+1 are brought into high levels, and the bit line isolation gates BTGn1, BTGn2, BTGn3, BTGn4, . . . conduct so that the memory block MB#n is connected to the sense amplifier circuits SAa1, SAa2, . . . and SAb1, SAb2 . . . included in adjacent sense amplifier bands SA#n and SA#n+1. Therefore, the sense amplifier bands SA#n and SA#n+1 sense, amplify and latch data of a memory cell included in a selected word line (selected page) of the memory block M#n. The adjacent memory blocks M#(n−1) and M#(n+1) are isolated from the sense amplifier bands SA#n and SA#n+1 and stay in precharge states (bit line isolation signals BLI2n−1 and BLI2n+2 are at low levels of inactive states).

FIG. 24 illustrates a specific structure of the sense amplifier circuits shown in FIG. 23. Referring to FIG. 24, a sense amplifier circuit SA0 is provided for the bit line pair BL0 and /BL0, and a sense amplifier circuit SA1 is provided for the bit line pair BL1 and /BL1. Each of the sense amplifier circuits SA0 and SA1 includes a precharge/equalize circuit PE which is activated in response to a bit line equalize instruction signal BLEQn for precharging and equalizing the corresponding bit line pair (BL0 and /BL0 or BL1 and /BL1) to a prescribed potential (intermediate potential VBL) level, a sense amplifier SA (SA0 or SA1) which is activated in response to a sense amplifier activation signal /SOPn or SONn for differentially amplifying and latching the potentials of the corresponding bit line pair, and an I/O gate IOG (IOG0 or IOG1) which conducts in response to a column selection signal CSL (CSL0 or CSL1) from a column decoder for connecting the corresponding bit line pair (BL0 and /BL0 or BL1 and /BL1) to local I/O lines LIOn and /LIOn.

The precharge/equalize circuit PE includes n-channel MOS transistors Tr1 and Tr2 which conduct in response to the bit line equalize instruction signal BLEQn for transmitting the intermediate potential VBL to the bit lines of the corresponding bit line pair, and an n-channel MOS transistor Tr3 which conducts in response to the bit line equalize instruction signal BLEQn for electrically shorting the corresponding bit line pair.

Each of the sense amplifiers SA0 and SA1 includes p-channel MOS transistors PT2 and PT3 which are cross-coupled with each other for driving a higher potential bit line of the corresponding bit line pair, a p-channel MOS transistor PT1 for activating the cross-coupled p-channel MOS transistors PT2 and PT3 in response to the sense amplifier activation signal /SOPn, n-channel MOS transistors NT2 and NT3 which are cross-coupled with each other for discharging a lower potential bit line of the corresponding bit line pair, and an n-channel MOS transistor NT1 which conducts in response to the sense amplifier activation signal SONn for activating the cross-coupled n-channel MOS transistors NT2 and NT3.

Each of the I/O gates IOG0 and IOG1 includes n-channel transistors Tra and Trb which conduct in response to a corresponding column selection signal CSL (CSL0 and CSL1) for connecting the corresponding bit line pair to the local I/O line pair LIOn and /LIOn.

The pair of local I/O lines LIOn and /LIOn extend only in the corresponding memory block along a word line extension direction (perpendicular to a bit line extension direction), and are connected to the global I/O lines GIO and /GIO respectively through a bank selection switch BSW. The global I/O lines GIO and /GIO, which are included in the global I/O bus GIOB, are arranged in a word line shunt region, for example.

The column selection signals CSL0 and CSL1, which are generated from the column decoder shown in FIG. 22 and transmitted over a plurality of memory blocks, are illustrated as being supplied to only the memory block MB#n in FIG. 24, for simplifying the illustration. The local I/O lines LIOn and /LIOn are generally precharged at a prescribed potential (intermediate potential), and no problem is caused even if they are connected with bit line pairs in non-selected memory blocks, since the bit line pairs are at the intermediate potential level of precharge states in the non-selected memory blocks. Alternatively, the logical products of the column selection signals CSL (CSL0 and CSL1) and the bank specifying signal φBA may be taken so that the bit line pair and the local I/O line pair are connected with each other only in the selected memory block (memory bank).

FIG. 25 schematically illustrates an operation sequence in case of driving a precharged bank to an active state. Referring to FIG. 25, it is assumed that the memory blocks (banks) M#n−1 and M#n+1 are in active states and the memory block M#n is in a precharge state. The sense amplifier bands SA#n−1 and SA#n latch memory cell data of a selected page of the memory block M#n−1. On the other hand, the sense amplifier bands SA#n+1 and SA#n+2 latch memory cell data of a selected page of the memory block M#n+1. In case of driving the memory block M#n to an active state in this state, the memory blocks M#n−1 and M#n+1 are returned to precharge states. Then, the memory block Men is driven to an active state. Due to this operation sequence, it is possible to prevent overwriting of a selected page of a newly activated memory block by destruction of latch data of a sense amplifier or latch data of an active sense amplifier in a shared sense amplifier structure.

FIG. 26 illustrates the structure of an access control part of the DRAM. Referring to FIG. 26, the access control part includes a precharge status bit memory area 74 for storing a precharge status bit P/A for each bank, a read control part 78 for controlling status bit reading with respect to the precharge status bit memory area 74, and a memory controller 90 for controlling an operation with respect to the read control part 78. The memory controller 90 includes an active controller 90d for determining whether or not it is necessary to issue an active command while issuing the active command in accordance with the result of the determination, and a determination circuit 90e for determining the value of a precharge status bit P/A read from the precharge status bit memory area 74 and transmitting the result of the determination to the active controller 90d under control by the active controller 90d.

The determination circuit 90e determines whether the value of the status bit P/A read from the precharge status bit memory area 74 is "0" or "1". The read control part 78 corresponds to the structure of the read/write control part 78 shown in FIG. 17. A command which is supplied to the command decoder included in the control part 78 shown in FIG. 17 from the active controller 90d is different from that in refreshing. The operation of the structure shown in FIG. 26 is now described with reference of a flow chart shown in FIG. 27.

The active controller 90d determines whether or not it is necessary to issue an active command in accordance with a command from a CPU (step S40). An active command is issued for the DRAM in case of a cache miss/page miss since the DRAM is utilized as a main memory of the CPU. If it is necessary to issue an active command, the active controller 90d supplies the read control part 78 with a precharge status bit P/A reading instruction as well as bank addresses BA specifying banks adjacent to a bank to be accessed in the DRAM. The read control part 78 successively reads the status bits P/A of the corresponding banks (adjacent banks) from the precharge status bit memory area 74 in accordance with the supplied bank addresses BA (step S41).

The determination circuit 90e determines whether the adjacent banks are in active states or precharge states (inactive states) in accordance with the values of the status bits P/A read from the precharge status bit memory area 74 (step S42). If at least one adjacent bank is in an active state, the active controller 90d issues a precharge command for the active adjacent bank with its adjacent bank address, and supplies the same to the DRAM. The active controller 90d supplies a command to a write control part (not shown; see FIG. 17), for resetting the precharge status bit P/A of the active adjacent bank of the precharge status bit memory area 74 and setting the same in a precharge state (step S43). At the step S43, precharge commands are successively issued to the adjacent memory banks, such as the memory blocks M#n−1 and M#n+1, for example, when both of these banks are in active states.

If both of the adjacent memory banks are in inactive states (precharge states) or the active adjacent bank is completely precharged, an active command and an address are issued for the corresponding memory bank to be accessed (step S44). Thus, the corresponding bank is activated and the corresponding page is selected. The active controller 90d supplies a command to the control part 78 after the issuance of the active command, and sets the corresponding status flag P/A of the precharge status bit memory area 74 in a state indicating an active state (as to this structure, see FIG. 17).

Also when the memory array has a shared sense amplifier arrangement, it is possible to prevent active memory banks from sharing sense amplifiers by holding precharge status flags (bits) for the respective banks, whereby a multi-bank structure DRAM correctly holding data can be implemented.

[Embodiment 7]

FIGS. 28A to 28C illustrate a mapping mode for a memory bank of a CPU page address space. Referring to FIG. 28A, the CPU page address space includes page addresses PAD#0 to PAD#M.

A DRAM includes memory banks B#0, B#1, . . . B#n−1, B#n, . . . Successive CPU page addresses are mapped in different banks in the DRAM. Namely, the CPU page address PAD#0 is mapped in the memory bank B#0, and the next CPU page address PAD#1 is mapped in the memory bank B#1, for example. The CPU page addresses PAD#n−1 and PAD#n are mapped in the memory banks B#n−1 and B#n respectively. When sense amplifier bands are provided in the DRAM in correspondence to the memory blocks respectively and adjacent memory blocks can be simultaneously activated, i.e., adjacent memory banks can be simultaneously activated, all successive pages can be selected in the DRAM.

CPU access has localization. Namely, operations are serially executed, and arithmetic processing of data of a prescribed area is performed in accordance with each instruction. Therefore, a probability for successive accesses to successive pages is so high that all pages of successive page addresses can be selected in the DRAM by activating all banks respectively. Therefore, the page hit rate can be improved and a penalty in a cache miss can be reduced.

FIG. 28B illustrates an exemplary conversion mode for a CPU address to a memory controller address (DRAM address). Referring to FIG. 28B, the CPU address includes address bits A21 to A0. The most significant bit (MSB) is the bit A21, and the least significant bit (LSB) is the bit A0. A CPU page address includes the address bits A21 to A9. The memory controller address includes bank address bits BA3 to BA0 and row address bits RA8 to RA0. The memory controller address utilizes the CPU address bits A8 to A0 as column addresses CA8 to CA0. The CPU address bits A12 to A9 are converted to the memory controller bank address bits BA3 to BA0, while the CPU address bits A21 to A13 are converted to the memory controller row address bits RA8 to RA0. A bank address is formed by four bits BA3 to BA0, and specifies 16 banks. Therefore, successive page addresses in the CPU address are successively allocated to adjacent banks.

Specifically, page addresses 0 and 1 of the CPU address are located in banks 0 and 1 of the DRAM respectively, and a page address 15 of the CPU address is located in a bank 15. A page address 16 of the CPU address is located in the bank 0 again. Due to this address allocation, therefore, successive page addresses of the CPU can be allocated to successively adjacent banks of the DRAM. The respective banks can be simultaneously activated, whereby successive pages (16 at the maximum) can be simultaneously selected for improving the page hit ratio. The banks 0, 1, . . ., 15 correspond to the memory banks B#0, B#1, . . . of the DRAM shown in FIG. 28A respectively.

FIG. 29 illustrates a structure for implementing the address mapping conversion shown in FIGS. 28A to 28C. Referring to FIG. 29, an address conversion part includes a barrel shifter 100a for receiving the CPU address bits A21 to A9 and shifting the same toward the least significant bit by a prescribed number of bits (four bits), and a buffer register 100b for receiving and storing the CPU address bits A8 to A0. The barrel shifter 100a outputs the bank address bits BA3 to BA0 and the row address bits RA8 to RA0, and the buffer register 100b outputs the column address bits CA8 to CA0. The buffer register 100b has a function of latching and outputting supplied data. This buffer register 100b is so provided that an address bit output timing matches a shift operation and a data output timing in the barrel shifter 100a. The barrel shifter 100a shifts the CPU address bits A21 to A9 toward the least significant bit by four bits, outputs the address bits A12 to A9 as the bank address bits BA3 to BA0, and outputs the CPU address bits A21 to A13 as the row address bits RA8 to RA0. It is possible to readily cope with an arbitrary number of banks by utilizing the barrel shifter 100a and adjusting the shift bit number.

[Modification]

FIG. 30A illustrates the structure of a modification of the embodiment 7 of the present invention. Referring to FIG. 30A, a DRAM includes banks B#0 to B#N and sense amplifier bands SA#0 to SA#N+1 which are shared by adjacent memory banks. In case of the shared sense amplifier structure shown in FIG. 30A, adjacent memory banks cannot be simultaneously selected. Therefore, successive CPU page addresses are located in alternate banks. For example, a page address PAD#i and a next page address PAD#i+1 are located in the banks B#0 and B#2 respectively. On the other hand, CPU page addresses PAD#j and PAD#j+1 are located in the banks B#1 and B#3 respectively. Therefore, successively adjacent CPU addresses are mapped in memory blocks not sharing the sense amplifier bands, whereby these successive CPU page addresses can be simultaneously selected in the DRAM, so that successive CPU page addresses can be simultaneously. selected and the page hit rate can be improved also in the DRAM of a shared sense amplifier structure.

FIG. 30B illustrates an address conversion mode for implementing the address mapping shown in FIG. 30A.

Referring to FIG. 30B, CPU address bits include bits A21 (most significant bit (MSB)) to A0 (least significant bit (LSB)). The CPU address bits A21 to A13 are employed as DRAM row address bits RA8 to RA0, and the CPU address bits A12 to A9 are employed as DRAM bank address bits BA3 to BA0. The CPU address bits A8 to A0 are employed as DRAM column address bits CA8 to CA0. The CPU address bit A12 is converted to the DRAM bank address bit BA0, while the CPU address bits A11 to A9 are converted to the DRAM bank address bits BA3 to BA1 respectively. The bank address bit BA1 corresponds to the least significant bit A9 of the CPU page address. As shown in FIG. 30C, therefore, pages (addresses) 0 to 7 of the CPU address are allocated to even numbered DRAM banks 0, 2, 4, . . . 14. Then, the bank address bit BA0 is brought into "1", and page addresses 8, 9, . . . 15 of a CPU address space are allocated to odd numbered DRAM banks 1, 3, . . . 15. Successive page addresses of a CPU are allocated to alternate memory banks, whereby successive pages can be simultaneously selected also in a multi-bank DRAM of a shared sense amplifier arrangement.

This address conversion can be implemented not only by wiring but also by employing a shifter array, as described later in detail.

According to the embodiment 7 of the present invention, as hereinabove described, successive CPU page addresses are allocated to different banks, whereby successive pages can be simultaneously selected in the DRAM and the page hit ratio can be improved.

[Embodiment 8]

FIG. 31A illustrates the structure of address mapping according to an embodiment 8 of the present invention. A CPU address includes bits A21 to A0. The CPU address bit A21 is converted to a bank address bit BA3. The CPU address bits A11 to A9 are converted to bank address bits BA2 to BA0 respectively. The CPU address bits A20 to A12 are converted to DRAM row address bits RA8 to RA0 respectively. The CPU address bits A8 to A0 are utilized as DRAM column address bits CA8 to CA0. Due to this address mapping, an area having the bit A21 of "0" is utilized as an instruction area, while that having the bit A21 of "1" is utilized as a data area.

As shown in FIG. 31B, therefore, addresses of the instruction area of a CPU address space having the bit A21 of "0" are mapped in address positions of banks B#0 to B#7 of a DRAM. On the other hand, the data area in the CPU address space having the CPU address bit A21 of "1" is mapped in DRAM banks B#8 to B#15. In the banks B#0 to B#7, successive CPU page addresses are mapped in different banks (adjacent banks). Referring to FIG. 31B, instruction information of a page address I#i is stored in the bank B#0, and information of an adjacent page address I#i+1 is stored in the bank B#1. Also in the banks B#8 to B#15 corresponding to the data area, adjacent page addresses of the data area are allocated to adjacent banks.

A data page address D#j is allocated to the bank B#8, and an adjacent data page address D#j+1 is allocated to the bank B#9. Also in this address mapping, therefore, the page hit rate can be improved by allocating successive page addresses to different memory banks in the respective ones of the instruction and data areas. This is because there is a high probability that information of successive page addresses of the instruction area is accessed when the instruction area is successively accessed, while there is a high probability that information of successive page addresses of the data area is successively accessed when information of the data area is accessed. Therefore, the page hit rate can be improved by providing the instruction and data areas independently of each other and allocating the respective banks thereto.

FIG. 31C illustrates another modification of the address mapping. Referring to FIG. 31C, a CPU address bit A21 is converted to a DRAM bank address bit BA3, CPU address bits A10 and A9 are converted to bank address bits BA2 and BA1 respectively, and a CPU address bit A11 is converted to a bank address bit BA0. This structure is similar to that shown in FIG. 30B, and successive pages are mapped in alternate memory banks in both instruction and data areas. Also when a DRAM of a shared amplifier arrangement is employed, therefore, page hit rate for information of the instruction area and that of the data area can be improved.

While the CPU address space is divided into two subaddress spaces (the instruction and data areas) in FIGS. 31A and 31B, the same may alternatively be divided to a larger number of subaddress spaces.

According to the embodiment 8 of the present invention, as hereinabove described, the CPU address space is divided into a plurality of subaddress spaces so that successive page addresses are allocated to different memory banks in units of the respective subaddress spaces, whereby the page hit rate can be remarkably improved.

FIG. 32 illustrates the structure of an address conversion part for implementing the aforementioned address conversion. Referring to FIG. 32, the address conversion part includes a shift data register 110 for storing shift bit number information, a mask data register 112 for storing mask data indicating a bit position for masking the shift, a decoder 114 for decoding the shift bit number information stored in the shift data register 110 and the mask position information stored in the mask data register 112 and generating a shift control signal, and a shifter array 116 for shifting the CPU address bits A21 to A0 in accordance with the shift control signal from the decoder 114 and generating the memory controller addresses (DRAM addresses) BA3 to BA0, RA8 to RA0 and CA8 to CA0. The shifter array 116, the structure of which is described later in detail, includes switching elements (shifters) arranged in the form of a matrix in its interior, and brings a switching element into a conducting state in accordance with the shift control signal from the decoder 114 for shifting a supplied CPU address bit. Dissimilarly to a structure of fixedly deciding the address conversion mode by interconnections, flexible address conversion can be implemented through the shifter array 116 depending on application.

FIG. 33 illustrates the structure of a part of the shifter array 116 shown in FIG. 32 for generating the DRAM row address bits RA8 to RA0. Referring to FIG. 33, row address bit transmission lines RA8 to RA0 are arranged along a row direction (horizontal direction in the figure), and control signal lines φ0 to φ3 for transmitting control signals supplied from the decoder 114 are arranged along a column direction (vertical direction in the figure). Signal lines and signals transmitted thereon are denoted by the same reference characters. Switching elements SW are provided on intersections between the signal lines φ0 to φ3 and RA8 to RA0. Each switching element SW conducts when the corresponding control signal is activated. Signal lines for transmitting the CPU address bits A21 to A12 are arranged on diagonal lines of the switching matrix. The signal lines A21 intersects with the signal line RAS, and the signal line A20 intersects with the signal lines RA7 and RA8, while the signal line A19 intersects with the signal lines RA6, RA7 and RA8. The signal lines A17 to A11 are arranged in a similar manner to the above. A signal line Aj is for an arbitrary address bit, and may be supplied with a necessary address signal.

When a control signal φ0 is activated, the address bits A21 to A13 are outputted as the row address bits RA8 to RA0. When a control signal φ1 is in an active state, the address bits A20 to A12 are outputted as the row address bits RA8 to RA0. When a control signal φ2 is brought into an active state, the CPU address bits A19 to A11 are outputted as the DRAM row address bits RA8 to RA0. A prescribed number of CPU address bits can be readily shifted by switching a signal propagation path by the switching matrix shown in FIG. 33. A signal propagation delay is only a delay in each switching element, whereby the address signal bits can be transmitted at a high speed.

The structure of the shifter array 116 shown in FIG. 33 is a mere example, and can be expanded depending on the number of required shift bits. The control signals φ0 to φ3 are outputted from the decoder 114 in accordance with the information stored in the shift data register 110 and the mask data register 112 shown in FIG. 32. When there is no masked address bit, for example, a shift bit number 14 is specified and the decoder 114 activates the control signal φ0. When masking of the most significant address bit A21 is indicated in the mask data register 112 or the shift bit number is specified as 13, the decoder 114 activates the control signal φ1.

In case of masking the most significant two bits A21 and A20, the shift data register 112 stores shift bit number data of 12, and the decoder 114 activates the control signal φ2. Successive address bits are shifted in the arrangement shown in FIG. 33, and therefore the decoder 114 may be so formed as to generate the control signals φ0 to φ3 in accordance with shift bit number information stored in the shift data register 110.

FIG. 34 illustrates the structure of a bank address generation part of the shifter array 116 shown in FIG. 32. Referring to FIG. 34, the bank address bit BA3 is outputted from a selector 118a for selecting one of the CPU address bits A21 and A12 in accordance with a control signal φ4. The bank address bit BA2 is outputted from a selector 118b for selecting one of the CPU address bits A20 and A11 in response to a control signal φ5. The bank address bits BA1 and BA0 are generated from the CPU address bits A10 and A9. When the mask data register 112 shown in FIG. 32 indicates that the most significant address bit A21 is to be masked, the control signal φ4 is activated and the selector 118a selects the CPU address. bit A21. In case of mask data for the CPU address bit A21 and being subject to no shift operation, the selector 118a selects the CPU address bit A12. When it is determined that the CPU address bit A20 is to be masked by data stored in the mask data register 112, the decoder 114 (see FIG. 32) activates the control signal φ5. The selector 118b selects the CPU address bit A20 and outputs the same as the bank address bit BA2 in response to the activation of the control signal φ5.

Due to the structure shown in FIG. 34, conversion of the bank addresses can be implemented.

In the structure of the bank address generation part shown in FIG. 34, adjacent memory banks can also be simultaneously activated. When the DRAM has a shared sense amplifier arrangement, the bank address bits BA3 to BA0 shown in FIG. 34 may be further properly shifted. A structure similar to that of the switching matrix shown in FIG. 33 can be utilized for shifting the bank address bits.

Due to the employment of the shifter array 116 consisting of a switching matrix for the structure of the address conversion part, as hereinabove described, the address conversion structure can be readily modified depending on the application, whereby flexible address allocation can be implemented. Structures similar to the switching devices SW shown in FIG. 33 may be employed for the selectors 118a and 118b, and signal propagation delays in row and bank address bits are equal to each other in this case since delay times in the switching elements are identical to each other.

[Embodiment 9]

FIG. 35 illustrates the structure of address mapping according to an embodiment 9 of the present invention. Referring to FIG. 35, a CPU address space includes a main memory area for storing instructions and data for arithmetic processing, and a frame memory area for storing image data. The main memory area and the frame memory area are address areas having most significant address bits A21 of "0" and "1" respectively. The main memory area is divided into an instruction area for storing the instructions, and a data area for storing the data. The instruction and data areas are address areas having address bit A20 of "0" and "1" respectively.

Due to the address mapping in the CPU address space shown in FIG. 35, a DRAM can also be employed for image processing, and a processor CPU can perform arithmetic processing of image data stored in the DRAM. The image data are generally inputted/outputted in raster scanning order. Ion case of making each page correspond to a single scanning line, therefore, successive pages are successively accessed. In this case, therefore, it is efficient to map successive pages of the frame memory area in different banks. In the main memory area, on the other hand, the instructions and the data are accessed with localization respectively. Therefore, successive pages of the instruction area as well as those of the data area are mapped in different banks respectively. Respective page addresses of the main memory area and the frame memory area can be allocated to the DRAM address space in a structure similar to those of the embodiments 7 to 9.

FIGS. 36A to 36C illustrate address mapping conversion modes in the embodiment 9 of the present invention. In FIG. 36A, when the most significant address bit A21 is at "0" and the main memory area of the CPU address space is specified, CPU address bits A21, A20, A10 and A9 are employed as DRAM bank address bits BA3 to BA0. CPU address bits A19 to A11 are employed as DRAM row address bits RA8 to RA0. CPU address bits A8 to A0 are employed as DRAM column address bits CA8 to CA0.

In case of this address mapping, banks B#0 to B#7 are employed as the main memory area, as shown in FIG. 36B. The instruction area having a bank address bit BA2 of "0", i.e., the CPU address bit A20 of "0", is allocated to the banks B#0 to B#3. On the other hand, the data area having a bank address bit BA2 of "1", i.e., the CPU address bit A20 of "1", is allocated to the banks B#4 to B#7. Therefore, one of four banks of each area is specified in accordance with the CPU address bits A10 and A9. Thus, successive page addresses can be mapped in different banks, resulting in improvement in page hit rate of the instruction and data areas respectively.

FIG. 36C illustrates an address conversion mode of the frame memory area. With respect to the frame memory area, CPU address bits A21 and A11 to A9 are employed as bank addresses BA3 to BA0. In this case, banks B#8 to B#15 (not shown) are employed as image data storage areas. The eight banks are specified by the CPU address bits A11 to A9, whereby different pages can be allocated to the respective banks, thereby improving the hit rate for the image data.

FIG. 37 illustrates a structure for switching address mapping mode on a memory area basis. Referring to FIG. 37, an address conversion part includes a shifter array 116 for receiving the CPU address bits A21 to A0, performing a shift operation and generating the DRAM address bits BA3 to BA0, RA8 to RA0 and CA8 to CA0, and a decoder 118 for receiving the CPU most significant address bit A21 and generating a control signal φ for controlling the shift mode of the shifter array 116. The structure shown in FIGS. 33 and 34 can be employed for the shifter array 116. The control signal φ for switching the address mapping mode is generated in accordance with the value of the CPU most significant address bit A21.

The decoder 118 may be combined with the decoder 114 shown in FIG. 32. In relation to FIGS. 33 and 34, the control signal φ1 shown in FIG. 33 is activated and the control signal φ4 is set at a state of selecting the bit A21 when the address bit A21 is "1". When the address bit 21 is "0", on the other hand, the control signal N2 shown in FIG. 33 is activated and the control signals φ4 and φ5 are set in states for selecting the address bits A21 and A20. Due to the employment of this shifter array structure, address conversion can be readily implemented in accordance with the accessed memory area with no complicated circuit structure.

The number of the divided memory areas of the CPU address space is not limited to the two including the main memory area and the frame memory area, but may be a larger number.

According to the embodiment 9 of the present invention, as hereinabove described, the CPU address space is divided into a plurality of subaddress areas and the address mapping mode is changed for different subaddress spaces, whereby adjacent page addresses can be simultaneously selected in an optimum mode in each subaddress space, and the page hit rate can be improved.

[Embodiment 10]

FIG. 38 illustrates the structure of a control circuit for a DRAM according to an embodiment 10 of the present invention. Referring to FIG. 38, the control circuit includes a tag memory 122 for storing set addresses for respective pages of CPU addresses, a page address memory 124 which is formed by extending the tag memory 122 (extending the same array) for storing a most recently selected page address for each bank, a comparator 126 for determining match/mismatch of set addresses supplied from a memory controller 120 and read from the tag memory 122, and a comparator 128 for determining match/mismatch of page addresses supplied from the memory controller 120 and read from the page address memory 124.

The set and page addresses are read from the tag memory 122 and the page address memory 124 at the same timing under control by the memory controller 120, and the comparators 126 and 128 determine cache and page hits at the same timing in parallel with each other. The memory controller 120 may output CPU addresses, or converted DRAM addresses shown in the aforementioned embodiment.

FIG. 39A illustrates correspondence between CPU and DRAM addresses. Referring to FIG. 39A, the CPU address includes a tag address, a set address and a block address. A CPU address space is divided into a plurality of areas each including a prescribed number of sets. Each divided area is specified by the tag address. A set specified by the set address includes a plurality of bits of data called a cache block. The cache block size is decided by the bit number of data transferred in a single cache miss cycle. As shown in FIG. 39B, a plurality of cache blocks are present in a single page (a single word line in a bank) of the DRAM. The cache blocks in the single page of the DRAM are specified by tag and set addresses. Among the cache blocks, specific data is specified by the CPU block address.

When a tag address is specified, therefore, a certain area is specified in a single memory bank B#, as shown by slant lines in FIG. 39C. The area specified with the tag address includes a specified page.

When an access request from a CPU is present, the memory controller 120 supplies a tag address and a bank address to the tag memory 122 and the page address memory 124 respectively. The tag memory 122 reads a set address stored in an area corresponding to the supplied tag address and supplies the same to the comparator 126. The comparator 126 is also supplied with a CPU set address from the memory controller 120. When the supplied two set addresses match each other, the comparator 126 activates a cache hit instruction signal CH. When the set addresses mismatch each other, on the other hand, the comparator 126 inactivates the cache hit instruction signal CH.

The comparator 128 compares a page address read from the page address memory 124 with a page address (DRAM row address) supplied from the memory controller 120, and activates a page hit instruction signal PH when the page addresses match each other, while it maintains the page hit instruction signal CH in an inactive state when the page addresses mismatch each other. The tag memory 122 and the page address memory 124 are provided in a common memory unit and the set address and the page address are read in parallel with each other under control by the memory controller 120 and a cache hit/miss and a page hit/miss are determined, whereby the page hit/miss can be determined at a high speed in a cache miss.

In a cache miss, therefore, it is not necessary to read a page address (row address) latched in the DRAM for newly comparing the same with a CPU address, and therefore a page hit/miss can be determined at a high speed. Since the page hit/miss is determined in parallel with the determination of the cache hit/miss, a sufficient time can be taken for determining the page hit/miss, and the operation frequency of this processor can be increased, since it is difficult to read the corresponding row address latched in the DRAM and determine match/mismatch at a high speed.

In the address correspondence shown in FIG. 39A, the CPU tag address is formed to include a DRAM bank address and a part of a DRAM page address. Alternatively, the tag address of the tag memory 122 may be identical to the bank address. In this case, the memory controller 120 need not separately transmit the tag and bank addresses, and the control is simplified.

According to the inventive microprocessor having a built-in DRAM, as described above, the DRAM is structured into a multi-bank structure, whereby pages can be efficiently and simultaneously selected in respective banks, the page hit ratio is improved, precharge/activation needs not be performed in a page miss, and power consumption can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device, comprising:
   an arithmetic processing unit for performing a processing in accordance with supplied instruction and data;

a dynamic random access memory formed on a same common semiconductor chip as said arithmetic processing unit for storing at least one of said data and said instruction, said dynamic random access memory having a plurality of memory cells arranged in a matrix of rows and columns, said rows corresponding to pages; and hit/miss determination means receiving an address signal from said arithmetic processing means for performing a determining operation determining whether said address signal designates a block of data most recently accessed on a page being selected in said dynamic random access memory, for determining whether said address signal designates said page being selected in parallel with said determining operation, and for outputting signals indicating the results of these determining operations.

2. The semiconductor integrated circuit device in accordance with claim 1, wherein said dynamic random access memory includes banks each including said pages, and said hit/miss determination means comprises:

a tag/page address storage circuit including a page address area storing a page address indicating a page being selected in each of the banks and a tag memory area storing a tag address specifying a data block on a most recently accessed one of said pages in each of said banks;

means for reading a corresponding tag address from said tag memory area in accordance with a supplied address and reading a corresponding page address of an addressed bank from said tag/page address storage circuit in accordance with said supplied address;

cache hit determination means for determining match/mismatch of a set address corresponding to said tag address read from said tag/page address storage circuit and a tag address included in said supplied address, and outputting a signal indicating a cache hit/miss in accordance with the result of determination; and page hit determination means for determining match/mismatch of said page address read from said tag/page address storage circuit and a page address included in said supplied address and outputting a signal indicating a page hit/miss in accordance with the result of determination.

* * * * *